(12) United States Patent
Sato et al.

(10) Patent No.: US 11,101,392 B2
(45) Date of Patent: Aug. 24, 2021

(54) SOLAR CELL ELEMENT AND METHOD FOR MANUFACTURING SOLAR CELL ELEMENT

(71) Applicant: KYOCERA CORPORATION, Kyoto (JP)

(72) Inventors: Jumpei Sato, Ritto (JP); Akira Murao, Moriyama (JP); Norihiko Matsushima, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/255,561

(22) Filed: Jan. 23, 2019

(65) Prior Publication Data

US 2019/0157475 A1 May 23, 2019

Related U.S. Application Data

(63) Continuation of application No. PCT/JP2017/027494, filed on Jul. 28, 2017.

(30) Foreign Application Priority Data

Jul. 28, 2016 (JP) .............................. JP2016-148131

(51) Int. Cl.
*H01L 31/0224* (2006.01)
*H01L 31/0216* (2014.01)
*H01L 31/18* (2006.01)

(52) U.S. Cl.
CPC .. *H01L 31/022425* (2013.01); *H01L 31/0216* (2013.01); *H01L 31/0224* (2013.01); *H01L 31/02167* (2013.01); *H01L 31/1868* (2013.01)

(58) Field of Classification Search
None
See application file for complete search history.

(56) References Cited

U.S. PATENT DOCUMENTS

2009/0205712 A1* 8/2009 Cousins .............. H01L 31/0745
 136/261
2010/0024880 A1 2/2010 Lee
(Continued)

FOREIGN PATENT DOCUMENTS

CN 103985769 A 8/2014
JP 2011-511453 A 4/2011
(Continued)

*Primary Examiner* — Devina Pillay
(74) *Attorney, Agent, or Firm* — Duane Morris LLP

(57) ABSTRACT

A solar cell element is provided with a semiconductor substrate, a passivation layer, and an electrode. The semiconductor substrate has a first surface and a second surface that is positioned on a back side of the first surface. The passivation layer is positioned on the second surface of the semiconductor substrate. The electrode is positioned on the passivation layer and positioned in the state of being electrically connected to the semiconductor substrate. The electrode includes a linear electrode part that is positioned along a peripheral edge of the semiconductor substrate when the semiconductor substrate is seen from the second surface side in plane perspective view, and is positioned in the state of penetrating the passivation layer in a thickness direction.

8 Claims, 16 Drawing Sheets

(56) References Cited

U.S. PATENT DOCUMENTS

| | | | |
|---|---|---|---|
| 2010/0037936 A1* | 2/2010 | Becker | H01L 31/02008 |
| | | | 136/248 |
| 2011/0100448 A1 | 5/2011 | Lee et al. | |
| 2012/0306058 A1 | 12/2012 | Vermang | |
| 2012/0318349 A1* | 12/2012 | Shim | H01L 31/02167 |
| | | | 136/256 |
| 2013/0109133 A1* | 5/2013 | Frei | H01L 31/022425 |
| | | | 438/98 |
| 2013/0118571 A1 | 5/2013 | Shim et al. | |
| 2013/0122635 A1* | 5/2013 | Lee | H01L 31/1876 |
| | | | 438/72 |
| 2014/0014175 A1 | 1/2014 | Ito et al. | |
| 2016/0027936 A1* | 1/2016 | Chang | H01L 31/022433 |
| | | | 136/256 |
| 2016/0284893 A1 | 9/2016 | Teramura et al. | |
| 2017/0077321 A1 | 3/2017 | Ito et al. | |

FOREIGN PATENT DOCUMENTS

| | | |
|---|---|---|
| JP | 2011-097005 A | 5/2011 |
| JP | 2012-253356 A | 12/2012 |
| WO | 2015182503 A1 | 3/2015 |
| WO | 2015/064696 A1 | 5/2015 |

\* cited by examiner

IV–IV

SOLAR CELL ELEMENT AND METHOD FOR MANUFACTURING SOLAR CELL ELEMENT

CROSS-REFERENCE TO RELATED APPLICATION

The present application is a continuation based on PCT Application No. PCT/JP2017/027494 filed on Jul. 28, 2017, entitled "SOLAR CELL ELEMENT AND METHOD FOR MANUFACTURING SOLAR CELL ELEMENT" which claims the benefit of Japanese Patent Application No. 2016-148131, filed on Jul. 28, 2016, entitled "SOLAR CELL ELEMENT AND METHOD FOR MANUFACTURING THE SAME", the contents of which are incorporated by reference herein in their entirety.

FIELD

The present disclosure relates to a solar cell element and a method for manufacturing a solar cell element.

BACKGROUND

As a crystalline silicon based solar cell element with high photoelectric conversion efficiency, a solar cell element having a passivated emitter and rear cell (PERC) structure is known. Such a solar cell element includes, on a silicon substrate a passivation layer, a protective layer for protecting this passivation layer, and an electrode positioned on this protective layer.

SUMMARY

A solar cell element and a method for manufacturing a solar cell element are disclosed.

One aspect of a solar cell element is provided with a semiconductor substrate, a passivation layer, and an electrode. The semiconductor substrate has a first surface and a second surface that is positioned on the back side of the first surface. The passivation layer is positioned on the second surface of the semiconductor substrate. The electrode is positioned on the passivation layer and positioned in the state of being electrically connected to the semiconductor substrate. The electrode includes a linear electrode part that is positioned along a peripheral edge of the semiconductor substrate when the semiconductor substrate is seen from the second surface side in plane perspective view, and is positioned in the state of penetrating the passivation layer in a thickness direction.

One aspect of a method for manufacturing a solar cell element includes forming a passivation layer and forming an electrode. The forming the passivation layer includes forming the passivation layer on a second surface of a semiconductor substrate having a first surface and the second surface that is positioned on a back side of the first surface. The forming the electrode includes forming the electrode so as to be positioned on the passivation layer and positioned in the state of being electrically connected to the semiconductor substrate. The electrode includes a linear electrode part that is positioned along a peripheral edge of the semiconductor substrate when the semiconductor substrate is seen from the second surface side in plane perspective view, and is positioned in the state of penetrating the passivation layer in a thickness direction.

DESCRIPTION OF EMBODIMENTS

Figure 1:
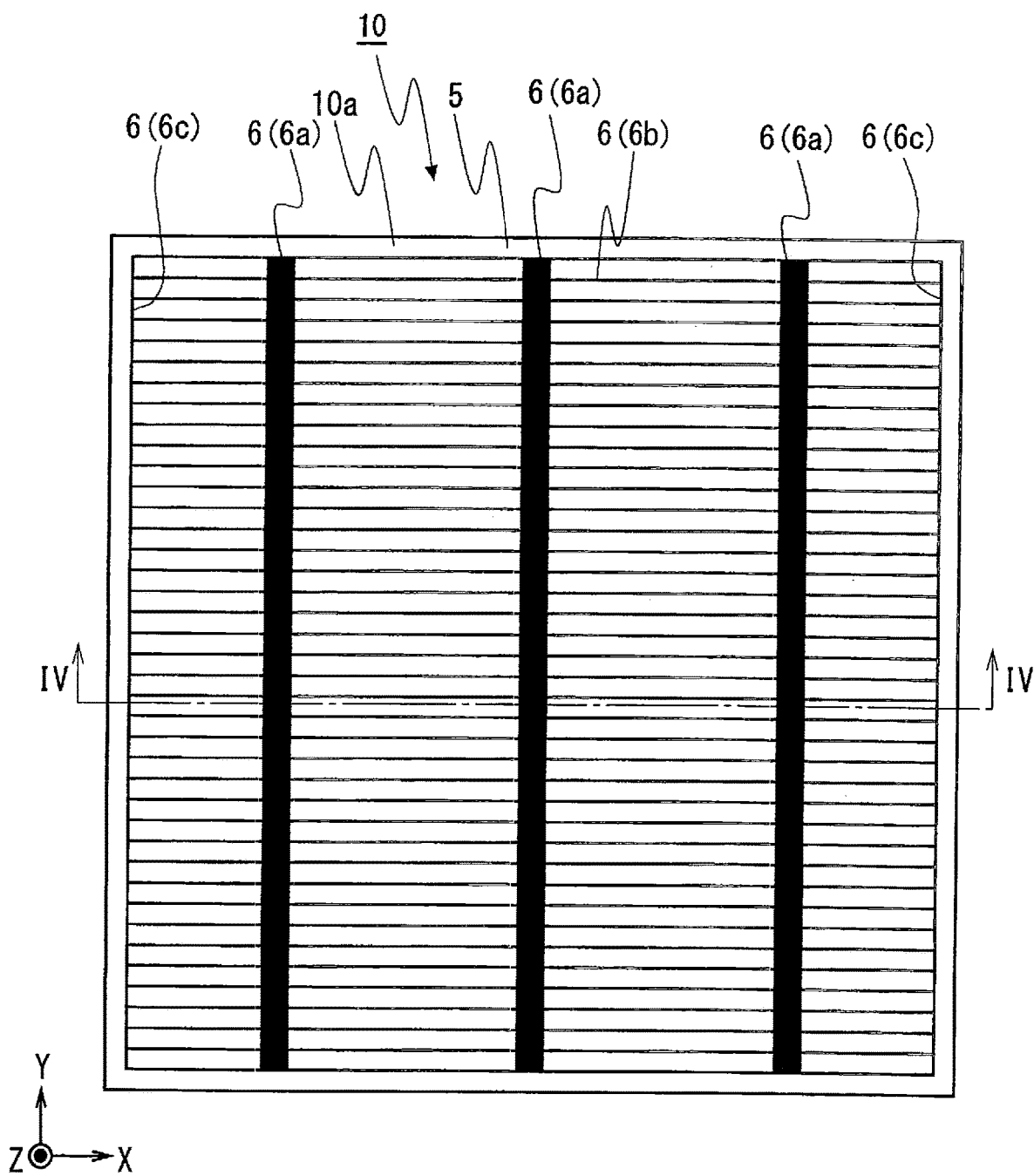
FIG. 1 illustrates a plan view showing an appearance of a first surface side of one example of a solar cell element according to a first embodiment to a fifth embodiment.

As a crystalline silicon based solar cell element having high power generation efficiency, for example, there is a solar cell element having a PERC structure. This solar cell element is provided with, for example, a passivation layer, a protective layer for protecting this passivation layer, and an electrode positioned on this protective layer, on a silicon substrate. This electrode can be formed by, for example, heating a material (also referred to as an electrode forming material) for forming an electrode on the protective layer.

However, for example, at the time of forming the electrode by heating the electrode forming material, the temperature of a peripheral edge of the protective layer, which is not covered with the electrode forming material, tends to increase more than the other portion covered with the electrode forming material. Therefore, at the peripheral edge of the protective layer along the peripheral edge of the semiconductor substrate, for example, the amount of expansion at the time of heating and the amount of contraction at the time of cooling are large, so that deformation due to the temperature change is large. For this reason, for example, peeling tends to occur at the peripheral edge of the protective layer at least either between the passivation layer and the protective layer or between the protective layer and the electrode. Then, for example, if the protective layer or the electrode peels off from the peripheral edge toward the central part side of the silicon substrate, the electric characteristics of the solar cell element may deteriorate. Further, for example, on the passivation layer or the protective layer, the adhesion of the electrode is reduced as compared with a structure in which the electrode is formed directly on the silicon substrate. Therefore, in an actual use environment, peeling of the electrode tends to occur from the peripheral edge to the central part side of the silicon substrate due to expansion and contraction of the electrode by heating and cooling.

Therefore, the inventors of the present application have created a technology to provide a solar cell element and a method for manufacturing a solar cell element, which are less prone to deterioration of electric characteristics. Concerning this, each embodiment will be described below with reference to the drawings.

The same reference signs are given to portions having similar structures and functions in the drawings, and description thereof will not be repeated below. The drawings are shown schematically. Right-hand XYZ coordinate systems are given in FIGS. 1 to 16. In this XYZ coordinate system, for example, a longitudinal direction of a front first electrode 6a on a first surface 10a which is a light receiving surface of a solar cell element 10 described later is taken as a +Y direction, a short direction of this front first electrode 6a is taken as a +X direction, and a normal direction of the first surface 10a is taken as a +Z direction.

1. First Embodiment 1-1. Basic Structure of Solar Cell Element

As shown in FIGS. 1 to 5, the solar cell element 10 has the first surface 10a positioned on the front surface side and a second surface 10b positioned on the side opposite to the first surface 10a. In addition, the solar cell element 10 is provided with a semiconductor substrate 1, a passivation layer 4, a protective layer 11, an antireflection layer 5, a front-surface electrode 6, and a back-surface electrode 8.

Like the solar cell element 10, the semiconductor substrate 1 has a first surface 1a positioned on the front surface side and a second surface 1b positioned on the side opposite to the first surface 1a.

The passivation layer 4 is positioned on at least the second surface 1b of the semiconductor substrate 1. On this passivation layer 4, the protective layer 11 is positioned. On the first surface 1a side of the semiconductor substrate 1, the front-surface electrode 6 is positioned. The front-surface electrode 6 includes a front first electrode 6a, a front second electrode 6b, and a front third electrode 6c. On the second surface 1b side of the semiconductor substrate 1, the back-surface electrode 8 is positioned. The back-surface electrode 8 includes a back first electrode 8a, a back second electrode 8b, a back third electrode 8c, and a back fourth electrode 8d.

Then, the back first electrode (also referred to as a first metal part) 8a is, for example, an electrode part in a linear shape (also referred to as a linear electrode part) that is positioned along the peripheral edge of the semiconductor substrate 1 when the solar cell element 10 is seen from the second surface 10b side in plane perspective view. Here, a peripheral edge of the semiconductor substrate 1 is a portion which forms an outer peripheral edge of the semiconductor substrate 1 when the solar cell element 10 is seen from the second surface 10b side in plane perspective view. Further, this back first electrode 8a is positioned in the state penetrating the passivation layer 4 in the thickness direction, for example. In this specification, viewing the solar cell element 10 from the second surface 10b side in plane perspective view and viewing the semiconductor substrate 1 from the second surface 1b side in plane perspective view are used synonymously. Therefore, for example, when the semiconductor substrate 1 is seen from the second surface 1b side in plane perspective view, the back first electrode 8a is positioned along a peripheral edge of the passivation layer 4 along the peripheral edge of the semiconductor substrate 1. For example, when the semiconductor substrate 1 has a polygonal shape in plan view, the back first electrode 8a may only include one or more electrode regions for each side of the semiconductor substrate 1. In the example of FIGS. 2 to 5, the back first electrode 8a is annularly positioned along the peripheral edge of the semiconductor substrate 1. From another viewpoint, for example, when the semiconductor substrate 1 is seen from the second surface 1b side in plane perspective view, the back first electrode 8a is sandwiched between the passivation layer 4 positioned outside this back first electrode 8a and the passivation layer 4 positioned inside this back first electrode 8a. Further, for example, when the semiconductor substrate 1 is seen from the second surface 1b side in plane perspective view, the back first electrode 8a surrounds the entire region, or a region other than the outer peripheral portion, of the protective layer 11.

For example, when the semiconductor substrate 1 is seen from the second surface 1b side in plane perspective view, a large number of linear or dotted back second electrodes (also referred to as second metal parts) 8b are positioned in a region (also referred to as a first region) A1 surrounded by the back first electrode 8a in a region on the second surface 1b of the semiconductor substrate 1. Both the back first electrode 8a and the back second electrode 8b are in contact with the second surface 1b of the semiconductor substrate 1.

The back third electrode 8c is positioned, for example, in the state of being electrically connected to each of the back first electrode 8a and the back second electrode 8b on the protective layer 11. In other words, the protective layer 11 is, for example, a portion positioned between the passivation layer 4 and the back third electrode 8c.

Here, for example, when the semiconductor substrate 1 is seen from the second surface 1b side in plane perspective view, the peripheral edge of the protective layer 11 may be positioned outside the peripheral edge of the back-surface electrode 8. From another viewpoint, for example, when the semiconductor substrate 1 is seen from the second surface 1b side in plane perspective view, the protective layer 11 may also be positioned in a region (also referred to as a second region A2) outside the back first electrode 8a in a region on the second surface 1b of the semiconductor substrate 1.

1-2. Specific Configuration of Solar Cell Element

Next, a specific configuration of the solar cell element 10 will be described. The semiconductor substrate 1 includes a first semiconductor region 2 and a second semiconductor region 3. The first semiconductor region 2 and the second semiconductor region 3 form a pn junction. For the semiconductor substrate 1, for example, a mono-crystalline or polycrystalline silicon substrate having a first conductivity type is used. For example, when the first conductivity type is p type, boron, gallium, or the like is adopted as a predetermined dopant element contained in the silicon substrate. The thickness of the semiconductor substrate 1 is, for example, 250 μm or less, and may be 150 μm or less, which is further thinner. The shape of the semiconductor substrate 1 is not particularly limited, but, for example, when having a quadrilateral shape in plan view, the semiconductor substrate 1 can be easily manufactured. In the first embodiment, the semiconductor substrate 1 mainly includes the first semiconductor region 2.

The second semiconductor region 3 is positioned, for example, on the first surface 1a side of the semiconductor substrate 1. The second semiconductor region 3 is, for example, a semiconductor region having a second conductivity type different from the first conductivity type. For example, when the first conductivity type is p type, n type is adopted as the second conductivity type. For example, when the second conductivity type is n type, the second semiconductor region 3 can be formed by diffusing a dopant element such as phosphorus in a surface layer part on the first surface 1a side of the semiconductor substrate 1. At this time, for example, a region other than the second semiconductor region 3 of the second conductivity type in the semiconductor substrate 1 can be the first semiconductor region 2 of the first conductivity type.

Figure 4:
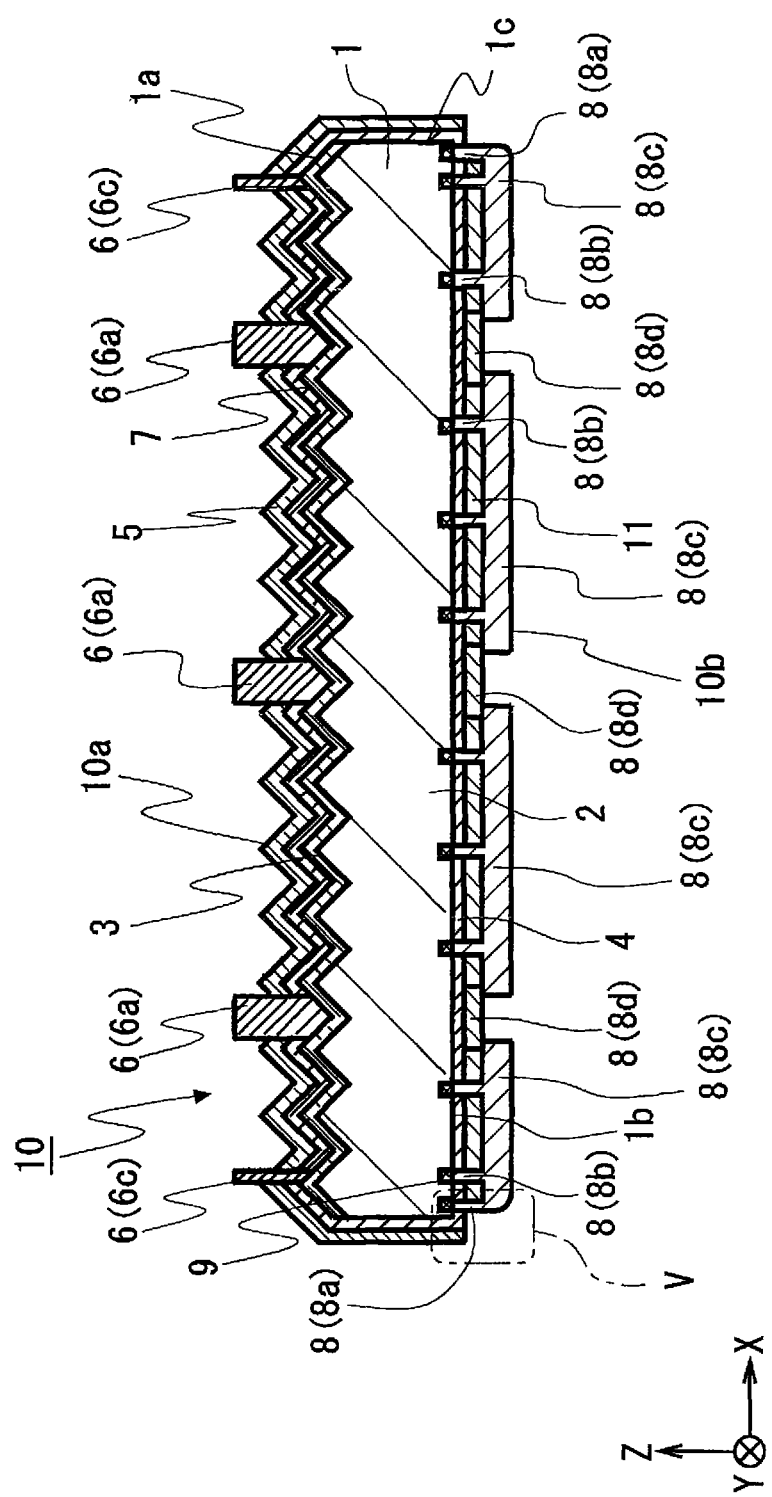
FIG. 4 illustrates an end view showing an end face when the solar cell element is cut along a line IV-IV in FIG. 1 and FIG. 2.

As shown in FIG. 4, the first surface 1a of the semiconductor substrate 1 may have an uneven part 7, for example. The height of each protrusion of the uneven part 7 is, for example, about 0.1 μm to 10 μm. The width of the protrusion of the uneven part 7 is, for example, about 1 μm to 20 μm. To the surface shape of the recess of the uneven part 7, for example, a surface shape such as a spherical shape or an inverted pyramid shape can be applied.

The passivation layer 4 is, for example, in contact with at least the second surface 1b of the semiconductor substrate 1. In other words, the passivation layer 4 is positioned, for example, on the second surface 1b side of the first semiconductor region 2. As a material of the passivation layer 4, for example, one or more materials selected from aluminum oxide, zirconium oxide, hafnium oxide, silicon oxide, silicon nitride, silicon oxynitride, and the like are adopted. The passivation layer 4 can exhibit a passivation effect including, for example, an electric field passivation effect by a built-in electric field and a passivation effect (also referred to as chemical passivation) by terminating a dangling bond at the interface. The electric field passivation effect by the built-in electric field can be caused, for example, by formation of an electric field in the vicinity of the interface between the second surface 1b of the semiconductor substrate 1 and the passivation layer 4 due to the presence of the passivation layer 4.

Here, for example, as the fixed charge density of the passivation layer 4 is larger, a larger electric field passivation effect is realized. For example, when the first semiconductor region 2 is p type silicon, a larger electric field passivation effect can be realized as long as the passivation layer 4 has a negative fixed charge. Concerning the chemical passivation, for example, as the interface state density becomes smaller, a larger passivation effect can be realized. Here, when the passivation layer 4 is present, recombination of minority carriers on the second surface 1b of the semiconductor substrate 1 is reduced by the passivation effect. Thereby, for example, the open circuit voltage and the short circuit current of the solar cell element 10 increase. As a result, the output characteristics of the solar cell element 10 are improved. An average value of the thickness of the passivation layer 4 is, for example, about 3 nm to 200 nm. The passivation layer 4 may also be positioned on the first surface 1a side of the semiconductor substrate 1, for example.

On the second surface 1b of the semiconductor substrate 1, for example, a large number of regions where the passivation layer 4 is not positioned are non-passivation parts. The non-passivation part functions as a contact portion for obtaining electrical contact between the back first electrode 8a and back second electrode 8b positioned on the passivation layer 4 and the semiconductor substrate 1. In other words, for example, a part of the back-surface electrode 8 is present on the non-passivation part. When the semiconductor substrate 1 is seen from the second surface 1b side in plane perspective view, the diameter (or width) of the back second electrode 8b is, for example, about 10 μm to 150 μm. The pitch of the plurality of back second electrodes 8b is, for example, about 0.05 mm to 2.0 mm. Further, for example, when the semiconductor substrate 1 is seen from the second surface 1b side in plane perspective view, the width of the back first electrode 8a is, for example, about 30 μm to 200 μm. Here, the back first electrode 8a may be constituted by, for example, a plurality of linear electrode portions which are arranged in an annular shape. In this case, the length of each linear electrode is, for example, about 10 mm to 40 mm.

The protective layer 11 is, for example, positioned on the passivation layer 4. This protective layer 11, for example, can protect the passivation layer 4. The thickness of the protective layer 11 is, for example, about 50 nm to 10 μm. For the material of the protective layer 11, for example, as a material different from the passivation layer 4, one or more materials such as silicon oxide, silicon nitride, silicon oxynitride can be adopted. For the material of the protective layer 11, for example, a similar material to that of the passivation layer 4 may be adopted.

The antireflection layer 5 has a role, for example, of reducing reflection of light in the solar cell element 10. The antireflection layer 5 is, for example, positioned on the first surface 1a side of the semiconductor substrate 1. To the material of the antireflection layer 5, for example, silicon nitride, silicon oxide, or the like is applied. The thickness of the antireflection layer 5 can be appropriately set according to the materials of the semiconductor substrate 1 and the antireflection layer 5, for example. Thus, in the solar cell element 10, for example, a condition that light in a specific wavelength region is difficult to be reflected is realized. The above "light in a specific wavelength region" refers to, for example, light in a wavelength range in which the solar cell element 10 can perform photoelectric conversion. Here, for example, as long as "light in a specific wavelength region" indicates light in a wavelength region including a wavelength (also referred to as a peak wavelength) at which the irradiation intensity of sunlight shows a peak and a wavelength before and after this peak wavelength, the photoelectric conversion efficiency of the solar cell element 10 can be increased. In the case where the semiconductor substrate 1 is a crystalline silicon substrate, the refractive index of the antireflection layer 5 is, for example, about 1.8 to 2.3. The average thickness of the antireflection layer 5 is, for example, about 20 nm to 120 nm. For example, the antireflection layer 5 may be positioned on the side surface 1c side of the semiconductor substrate 1. The side surface 1c is, for example, a surface connecting the first surface 1a and the second surface 1b in the semiconductor substrate 1.

A third semiconductor region 9 is positioned, for example, on the second surface 1b side of the semiconductor substrate 1. For example, the same conductivity type as that of the first semiconductor region 2 is applied to the conductivity type of the third semiconductor region 9. For example, when the first conductivity type of the first semiconductor region 2 is p type, p type is adopted as the conductivity type of the third semiconductor region 9. Here, for example, the concentration of the dopant contained in the third semiconductor region 9 is higher than that in the first semiconductor region 2. The third semiconductor region 9 forms an internal electric field, for example, on the second surface 1b side of the semiconductor substrate 1. Thereby, for example, in the vicinity of the second surface 1b of the semiconductor substrate 1, photoelectric conversion efficiency is hardly reduced by recombination of minority carriers. The third semiconductor region 9 can be formed by diffusing dopant elements such as boron or aluminum in a surface layer part on the second surface 1b side of the semiconductor substrate 1, for example. Here, the concentration of the dopant element contained in the first semiconductor region 2 is, for example, about $5\times10^{15}$ atoms/cm$^3$ to $1\times10^{17}$ atoms/cm$^3$. The concentration of the dopant element contained in the third semiconductor region 9 is, for example, about $1\times10^{18}$ atoms/cm$^3$ to about $5\times10^{21}$ atoms/cm$^3$. The third semiconductor region 9 is present, for example, at a contact portion between the back second electrode 8b and the semiconductor substrate 1. Further, the third semiconductor region 9 may be present, for example, at a contact portion between the back first electrode 8a and the semiconductor substrate 1.

The front-surface electrode 6 is positioned, for example, on the first surface 1a side of the semiconductor substrate 1. As shown in FIG. 1, the front-surface electrode 6 includes, for example, a plurality of front first electrodes 6a as a plurality of front surface bus bar electrodes and a plurality of front second electrodes 6b as a plurality of linear front surface finger electrodes. At least a part of the front first electrode 6a intersects the plurality of front second electrodes 6b. Thereby, the front first electrode 6a is electrically connected to the plurality of front second electrodes 6b. The width of the front second electrode 6b in the short direction is, for example, about 50 µm to 200 µm. The width of the front first electrode 6a in the short direction is, for example, about 1.3 mm to 2.5 mm. In other words, the width of the front second electrode 6b in the short direction is smaller than the width of the front first electrode 6a in the short direction. The interval between adjacent front second electrodes 6b of the plurality of front second electrodes 6b is, for example, about 1 mm to 3 mm. The thickness of the front-surface electrode 6 is, for example, about 10 µm to 40 µm. The front third electrode 6c as a front surface auxiliary electrode having a similar shape to the front second electrode 6b may, for example, be positioned along the peripheral edge of the semiconductor substrate 1 and electrically connect the front second electrodes 6b to each other. Further, for example, silver, copper, or the like is mainly applied to the material of the front-surface electrode 6.

Figure 2:
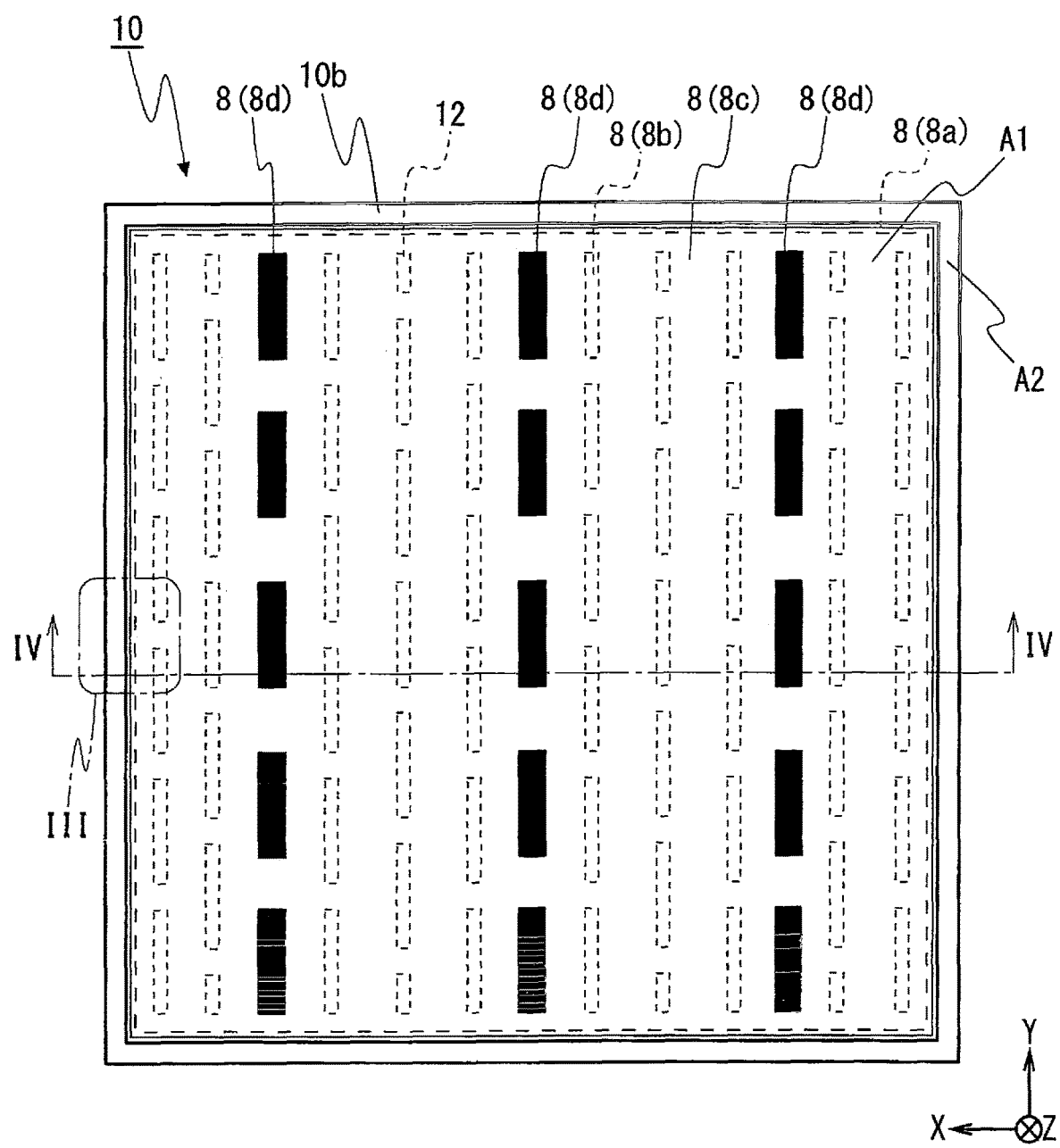
FIG. 2 illustrates a plan view showing an appearance of a second surface side of one example of the solar cell element according to the first embodiment.
Figure 3:
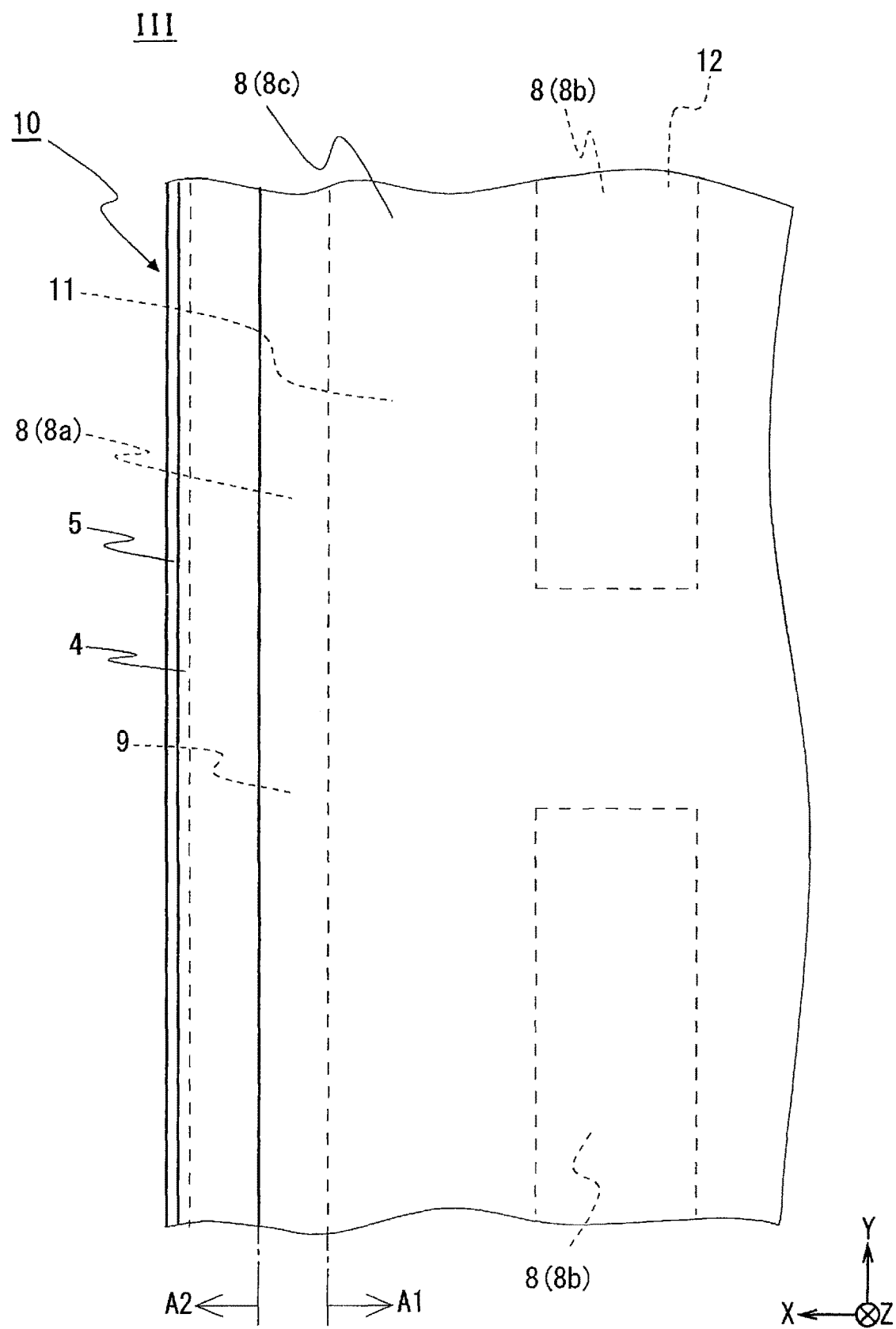
FIG. 3 illustrates an enlarged plan view showing an appearance of an example of a portion III in FIG. 2.

As shown in FIGS. 2 to 4, the back-surface electrode 8 includes, for example, the back first electrode 8a, the back second electrode 8b, the back third electrode 8c, and a plurality of the back fourth electrodes 8d as a plurality of back surface bus bar electrodes, each electrode having been described above. The width of the back fourth electrode 8d in the short direction is, for example, about 1.3 mm to 3 mm. The thickness of the back third electrode 8c is, for example, about 10 µm to 40 µm. For example, silver, copper, or the like is mainly applied to the material of the back fourth electrode 8d. For example, aluminum is mainly applied to the materials of the back first electrode 8a, the back second electrode 8b, and the back third electrode 8c.

Figure 5:
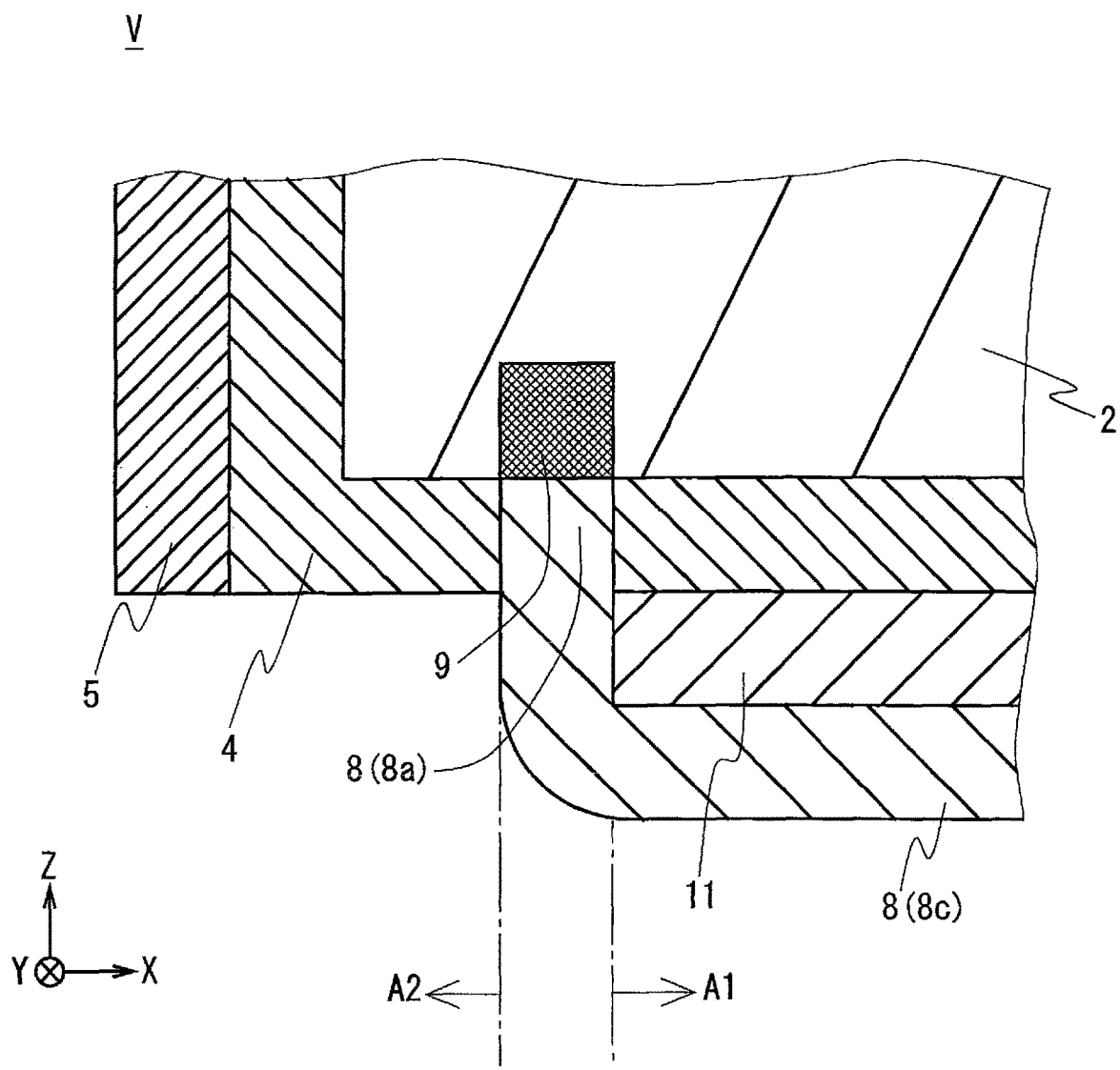
FIG. 5 illustrates an enlarged end view showing an end face of one example of a portion V in FIG. 4.
Figure 6:
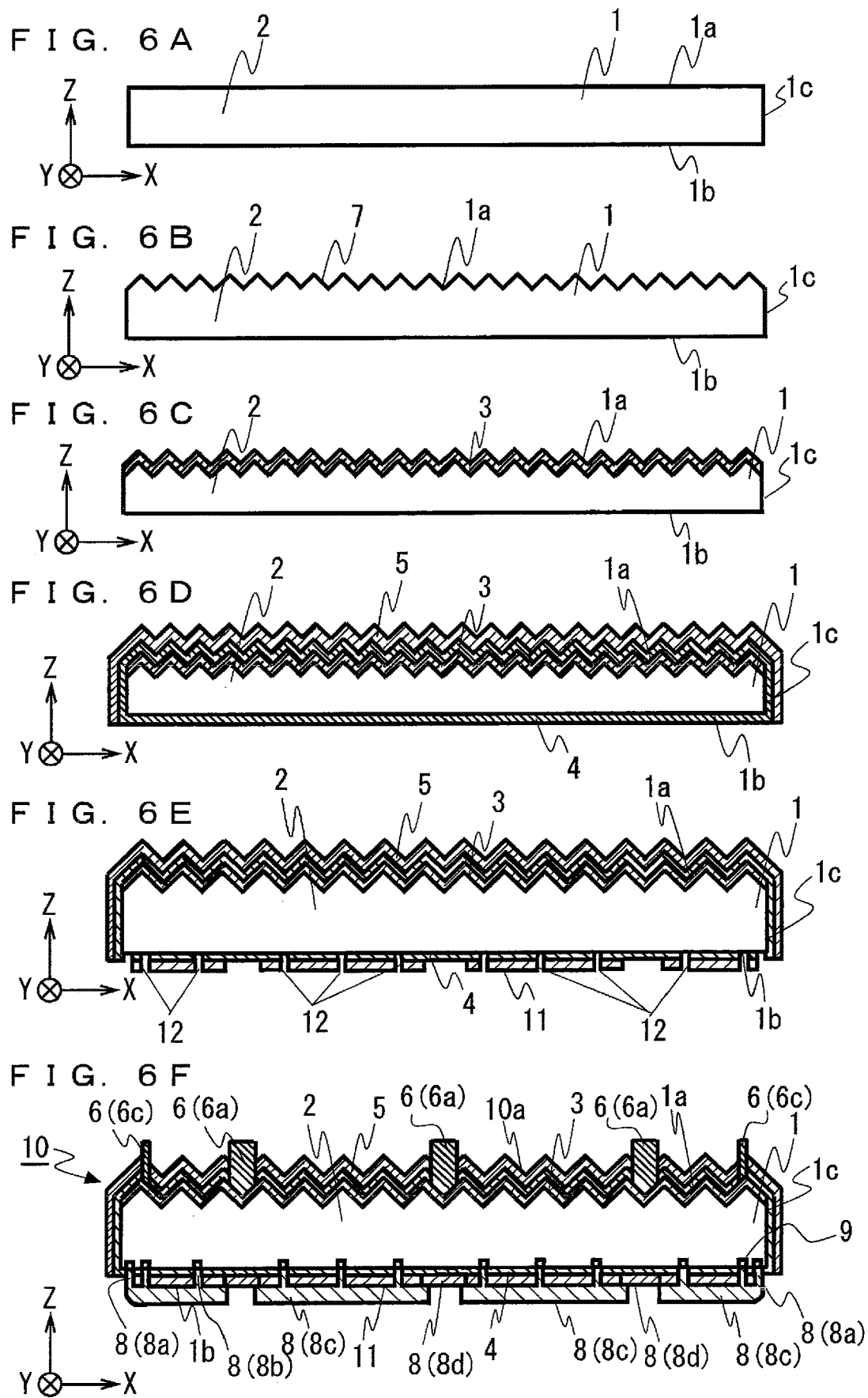
FIGS. 6A to 6F illustrate end views each showing the state in the course of manufacturing of a portion of the solar cell element according to the first embodiment, the portion corresponding to the end face in FIG. 4.
Figure 7:
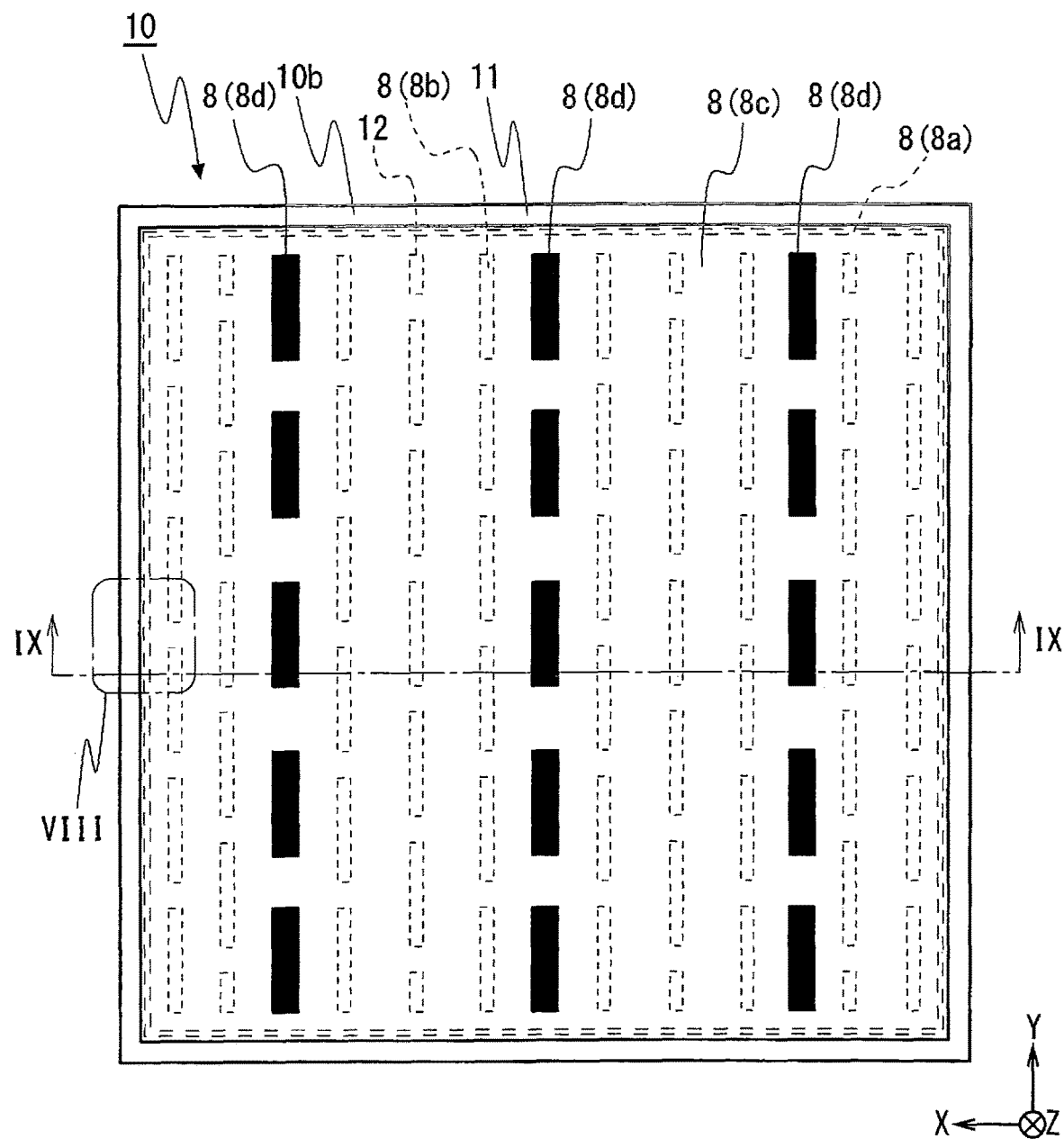
FIG. 7 illustrates a plan view showing an appearance of a second surface side of one example of a solar cell element according to a second embodiment.

As shown in FIGS. 3 to 5, for example, when the semiconductor substrate 1 is seen from the second surface 1b side in plane perspective view, in the vicinity of the peripheral edge of the protective layer 11, the back first electrode 8a is positioned inside the peripheral edge of the passivation layer 4 along the peripheral edge of the passivation layer 4. In the example of FIGS. 3 to 5, the back first electrode 8a is constituted by an annular one linear electrode part while passing through the passivation layer 4.

As shown in FIG. 5, here, for example, the passivation layer 4 and the protective layer 11 positioned in the first region A1 are surrounded laterally by the back first electrode 8a, and covered with the back third electrode 8c from the second surface 10b side. For this reason, for example, the temperature of the protective layer 11 becomes less likely to rise at the time of heating in the step of forming the front-surface electrode 6 and the back-surface electrode 8, and the influence of the expansion and contraction of the protective layer 11 according to the temperature change is reduced. Hence the stress due to the expansion and contraction of the protective layer 11 is reduced to cause the passivation layer 4 to hardly peel off. In addition, for example, the back-surface electrode 8 is also brought into close contact with the semiconductor substrate 1 at the back first electrode 8a along the peripheral edge of the semiconductor substrate 1, so that the back-surface electrode 8 hardly peels off the semiconductor substrate 1. As a result, for example, the electrical characteristics in the solar cell element 10 hardly deteriorate under the actual use environment. The side surfaces of the passivation layer 4 and the protective layer 11 positioned in the first region A1 are surrounded by the back first electrode 8a. Thereby, for example, entry of moisture from the peripheral edge of the solar cell element 10 toward the passivation layer 4 and the protective layer 11 can be reduced. Thus, for example, deterioration of the passivation layer 4 in the first region A1 can be reduced. As a result, the electrical characteristics in the solar cell element 10 hardly deteriorate under the actual use environment. Therefore, the long-term reliability in the solar cell element 10 under the actual use environment can be improved.

1-3. Method for Manufacturing Solar Cell Element

Next, an example of a method for manufacturing the solar cell element 10 will be described with reference to FIG. 6A to FIG. 6F.

First, as shown in FIG. 6A, a semiconductor substrate 1 having a p type first semiconductor region 2 is prepared. The semiconductor substrate 1 is formed by, for example, an existing casting method. Hereinafter, an example in which a polycrystalline silicon substrate having a p type conductivity type is used as the semiconductor substrate 1 will be described, but the semiconductor substrate 1 may have an n type conductivity type and other silicon substrates such as a mono-crystalline silicon may also be used as the semiconductor substrate 1. Here, first, an ingot of polycrystalline silicon is produced by the casting method, for example. Next, the ingot is cut into slices each having a thickness of 250 µm or less, for example, to prepare the semiconductor substrate 1. Then, for example, in order to remove a mechanically-damaged layer and a contaminated layer of the cut surface of the semiconductor substrate 1, the surface of the semiconductor substrate 1 which includes the side surface 1c may be slightly etched with a solution of NaOH, KOH, hydrofluoric acid, nitric hydrofluoric acid, or the like.

Next, as shown in FIG. 6B, the uneven part 7 is formed on the first surface 1a of the semiconductor substrate 1. As a method for forming the uneven part 7, for example, there can used wet etching using an alkaline solution of NaOH and the like or an acid solution of nitric hydrofluoric acid and the like, or dry etching using reactive ion etching (RIE), or the like. In the case of using the wet etching method, for example, the uneven part formed on the second surface 1b side of the semiconductor substrate 1 may be removed as required.

Next, as shown in FIG. 6C, the second semiconductor region 3 is formed in the surface layer part on the first surface 1a side of the semiconductor substrate 1 which has the uneven part 7 formed in the above step.

The second semiconductor region 3 is formed, for example, by a coating thermal diffusion method in which phosphorus pentoxide ($P_2O_5$) in a paste state is applied to the surface of the semiconductor substrate 1 and phosphorus is thermally diffused, a vapor phase thermal diffusion method in which phosphorus oxychloride ($POCl_3$) in a gaseous state is used as a diffusion source of phosphorus, or the like. The second semiconductor region 3 is formed to have, for example, a depth of about 0.2 μm to 2 μm and sheet resistance of about 40Ω/□ to 200Ω/□. For example, in the vapor phase thermal diffusion method, the semiconductor substrate 1 is subjected to heat treatment in an atmosphere containing a diffusion gas such as $POCl_3$ at a temperature of about 600° C. to 800° C. for about 15 minutes to 30 minutes, so that phosphorus glass is formed on the surface of the semiconductor substrate 1. Thereafter, the semiconductor substrate 1 is subjected to a heat treatment in an atmosphere of an inert gas such as argon or nitrogen at a high temperature of about 800° C. to 900° C. for about 10 minutes to 40 minutes, so that phosphorus diffuses from the phosphorus glass into the surface layer part of the semiconductor substrate 1, and the second semiconductor region 3 is formed in the surface layer part on the first surface 1a side of the semiconductor substrate 1.

Here, for example, when the second semiconductor region 3 is also formed on the second surface 1b side in the step of forming the second semiconductor region 3 described above, the second semiconductor region 3 formed on the second surface 1b side is removed by etching. Thereby, the p type first semiconductor region 2 is exposed on the second surface 1b of the semiconductor substrate 1. Here, for example, the second semiconductor region 3 formed on the second surface 1b side of the semiconductor substrate 1 can be removed by immersing the second surface 1b side of the semiconductor substrate 1 in a nitric hydrofluoric solution. Then, the phosphorus glass, which has adhered to the first surface 1a side of the semiconductor substrate 1 at the time of forming the second semiconductor region 3, is removed by etching. Here, for example, the second semiconductor region 3 formed on the side surface 1c side may be removed by etching. By removing the second semiconductor region 3 formed on the second surface 1b side of the semiconductor substrate 1 with the phosphorus glass remaining on the first surface 1a side of the semiconductor substrate 1 as thus described, the second semiconductor region 3 on the first surface 1a side of the semiconductor substrate 1 is hardly removed and hardly damaged.

Here, for example, in the step of forming the second semiconductor region 3, a diffusion mask may be formed in advance on the second surface 1b side of the semiconductor substrate 1, and the diffusion mask may be removed after formation of the second semiconductor region 3 on the first surface 1a side of the semiconductor substrate 1. Also, by such a process, the structure shown in FIG. 6C can be formed. In this case, the second semiconductor region 3 is not formed on the second surface 1b side of the semiconductor substrate 1, and the step of removing the second semiconductor region 3 on the second surface 1b side of the semiconductor substrate 1 is unnecessary.

The method of forming the second semiconductor region 3 is not limited to the above method, but for example, an n type hydrogenated amorphous silicon film, a crystalline silicon film containing a microcrystalline silicon film, or the like may be formed by using a thin film technique.

As described above, it is possible to prepare the semiconductor substrate 1 including the p type first semiconductor region 2, in which the n type second semiconductor region 3 is positioned on the first surface 1a side of the semiconductor substrate 1 and the uneven part 7 is formed on the surface.

Next, as shown in FIG. 6D, a passivation layer 4 is formed on at least the second surface 1b side of the semiconductor substrate 1. As a method of forming the passivation layer 4, for example, an atomic layer deposition (ALD) method, a plasma enhanced chemical vapor deposition (PECVD) method, or the like is used. Here, for example, as shown in FIG. 6D, the passivation layer 4 may be formed not only on the second surface 1b side of the semiconductor substrate 1 but also on the first surface 1a side and the side surface 1c side.

Here, for example, in the case of adopting the ALD method, first, the semiconductor substrate 1 in which the second semiconductor region 3 is formed is placed in a chamber of a film forming apparatus. Next, in a state where the semiconductor substrate 1 is heated in the temperature range of 100° C. to 250° C., four steps of supply of the aluminum raw material, removal of the aluminum raw material by exhaust, supply of an oxidizing agent, and removal of the oxidizing agent by exhaust are repeated multiple times. Hence the passivation layer 4 having a desired thickness and mainly containing aluminum oxide can be formed. As the aluminum raw material, for example, trimethylaluminum (TMA), triethylaluminum (TEA), or the like can be used. As the oxidizing agent, for example, water, ozone gas, or the like can be used.

Next, as shown in FIG. 6D, an antireflection layer 5 is formed on at least the first surface 1a side of the semiconductor substrate 1. As a method for forming the antireflection layer 5, for example, the PECVD method, the ALD method, a vapor deposition method, a sputtering method, or the like is adopted. Here, for example, when the PECVD method is adopted, first, the semiconductor substrate 1 on which the passivation layer 4 is formed is placed in a chamber of the film forming apparatus. Next, a mixed gas of a silane gas and an ammonia gas, which has been diluted with a nitrogen gas, is turned into plasma by glow discharge decomposition in the chamber, and deposited in the form of silicon nitride on the passivation layer 4 on the first surface 1a side of the semiconductor substrate 1. Thereby, the antireflection layer 5 containing silicon nitride is formed. The temperature in the chamber during deposition of silicon nitride is, for example, about 500° C. For example, when the antireflection layer 5 is formed by the PECVD method, the vapor deposition method, the sputtering method, or the like other than the ALD method, the antireflection layer 5 having a desired thickness can be formed in a short time. This can improve the productivity of the solar cell element 10.

Next, as shown in FIG. 6E, a protective layer 11 mainly containing silicon nitride, silicon oxide, or the like is formed on the passivation layer 4 formed on the second surface 1b side of the semiconductor substrate 1 by a vacuum process, a coating method, or the like. The vacuum process includes, for example, the PECVD method, the sputtering method or the like. The coating method includes, for example, a screen-printing method, a spray method or the like. It is thereby possible to form a laminated structure having both the function of generating the passivation effect of the passivation layer 4 and the function of the protective layer of silicon nitride, silicon oxide, or the like.

Further, the protective layer 11 may be formed into a desired pattern by a coating method. Here, the insulating paste is applied to a region of the second surface 1b side of the semiconductor substrate 1 excluding a region in which the back first electrode 8a and the back second electrode 8b are to be formed, whereby the step of forming a contact hole 12 described later becomes unnecessary. In this case, in the step of forming the back-surface electrode 8, the passivation layer 4 in the region where the back first electrode 8a and the back second electrode 8b are formed is fire-through.

Further, for example, when the protective layer 11 is formed in a region having a predetermined distance from the end of the semiconductor substrate 1, the solar cell element 10 having a structure in which the protective layer 11 is surrounded laterally by the back first electrode 8a can be easily produced.

In the protective layer 11, for example, the contact hole 12 for obtaining electrical connection to the semiconductor substrate 1 by the back first electrode 8a and the back second electrode 8b of the back-surface electrode 8 is positioned. The contact hole 12 is a void part for forming a non-passivation part in the passivation layer 4. The contact hole 12 is, for example, formed by a method such as laser beam irradiation or etching after formation of a patterned etching mask. For example, in the case of forming the contact hole 12 by laser beam irradiation, an average interval between the contact holes 12 adjacent to each other is adjusted by the irradiation position of the laser beam. For example, in a case where the contact hole 12 is formed by using a patterned etching mask, the average interval between the contact holes 12 adjacent to each other and the average plane area of the contact holes 12 can be set to desired values by changing the shape of an opening of the etching mask. By the above method, the contact hole 12 can be easily formed.

Next, as shown in FIG. 6F, the front-surface electrode 6 and the back-surface electrode 8 are formed.

The front-surface electrode 6 is produced, for example, using a metal paste (also referred to as a first metal paste) that contains a metal powder containing silver as a main component, an organic vehicle, and a glass frit. Here, first, the first metal paste is applied to the first surface 1a side of the semiconductor substrate 1. After this application, the solvent of the first metal paste may be evaporated and dried at a predetermined temperature. Thereafter, the applied first metal paste is heated at a maximum temperature of 600° C. to 800° C. for about several tens of seconds to several tens of minutes. Thereby, the first metal paste is fired to form the front-surface electrode 6. The application of the first metal paste can be realized by the screen-printing method, or the like, for example. For example, by using the screen-printing method, for example, the front-surface electrode 6 including the front first electrode 6a, the front second electrode 6b, and the front third electrode 6c can be formed in one step.

The back fourth electrode 8d is formed, for example, using a metal paste (also referred to as a second metal paste) that contains a metal powder containing silver as a main component, an organic vehicle, and a glass frit. Here, first, the second metal paste is applied onto the passivation layer 4 on the second surface 1b side of the semiconductor substrate 1. The application of the second metal paste can be realized by, for example, the screen-printing method. Thereafter, the applied second metal paste is heated at a maximum temperature of 600° C. to 800° C. for about several tens of seconds to several tens of minutes. Thereby, the second metal paste is fired to form the back fourth electrode 8d.

The back first electrode 8a, the back second electrode 8b, and the back third electrode 8c are formed, for example, using a metal paste (also referred to as a third metal paste) that contains a metal powder containing aluminum as a main component, an organic vehicle, and a glass frit. Here, first, the third metal paste is applied to the second surface 1b side of the semiconductor substrate 1. At this time, for example, the third metal paste may be applied in such a manner so as to overlap and contact a part of the back fourth electrode 8d produced as described above. Further, at this time, for example, the third metal paste may be applied to almost the entire surface of the second surface 1b side of the semiconductor substrate 1 except for the portion where the back fourth electrode 8d is formed. For example, by the application of the third metal paste, the third metal paste is also applied to the portion in the contact hole 12 of the protective layer 11 on the passivation layer 4. The application of the third metal paste can be realized by, for example, the screen-printing method, or the like. After this application of the third metal paste, for example, the solvent of the third metal paste may be evaporated and dried at a predetermined temperature. Thereafter, the semiconductor substrate 1, to which the third metal paste has applied, is heated at the maximum temperature of 600° C. to 800° C. for about several tens of seconds to several tens of minutes. Thereby, the third metal paste is fired to simultaneously form the back first electrode 8a, the back second electrode 8b, and the back third electrode 8c. At this time, for example, along with the formation of the back second electrode 8b, the third semiconductor region 9 is also formed. In addition, for example, the third semiconductor region 9 may be formed along with the formation of the back first electrode 8a. Here, for example, the back fourth electrode 8d may be formed simultaneously with the back first electrode 8a, the back second electrode 8b, and the back third electrode 8c.

The solar cell element 10 can be produced in the above steps.

The present disclosure is not limited to the first embodiment, but various modifications, improvements, and the like are possible as in the other embodiments described below, for example.

2. Other Embodiments

2-1. Second Embodiment

In the solar cell element 10 according to the first embodiment, for example, the back-surface electrode 8 may also be positioned in the second region A2.

As shown in FIGS. 7 to 10, the second embodiment is different from the first embodiment in that, for example, both the protective layer 11 and the back third electrode 8c are positioned in the state of also extending to the second region A2, and the passivation layer 4 of the second region A2 is covered with the protective layer 11. The other configurations of the second embodiment are similar to those of the first embodiment, and hence the explanation will be omitted.

Figure 8:
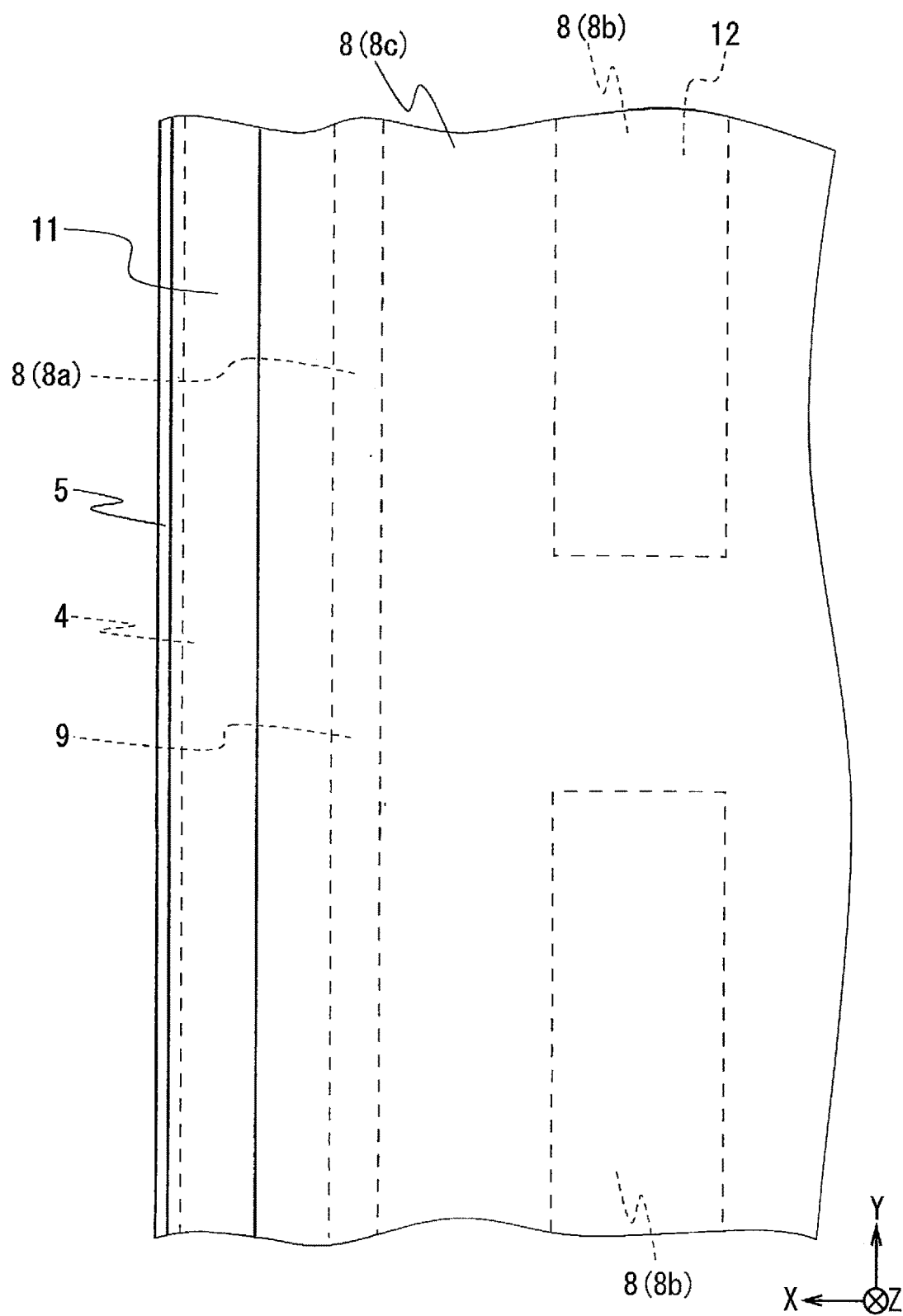
FIG. 8 illustrates an enlarged plan view showing an appearance of an example of a portion VIII in FIG. 7.
Figure 9:
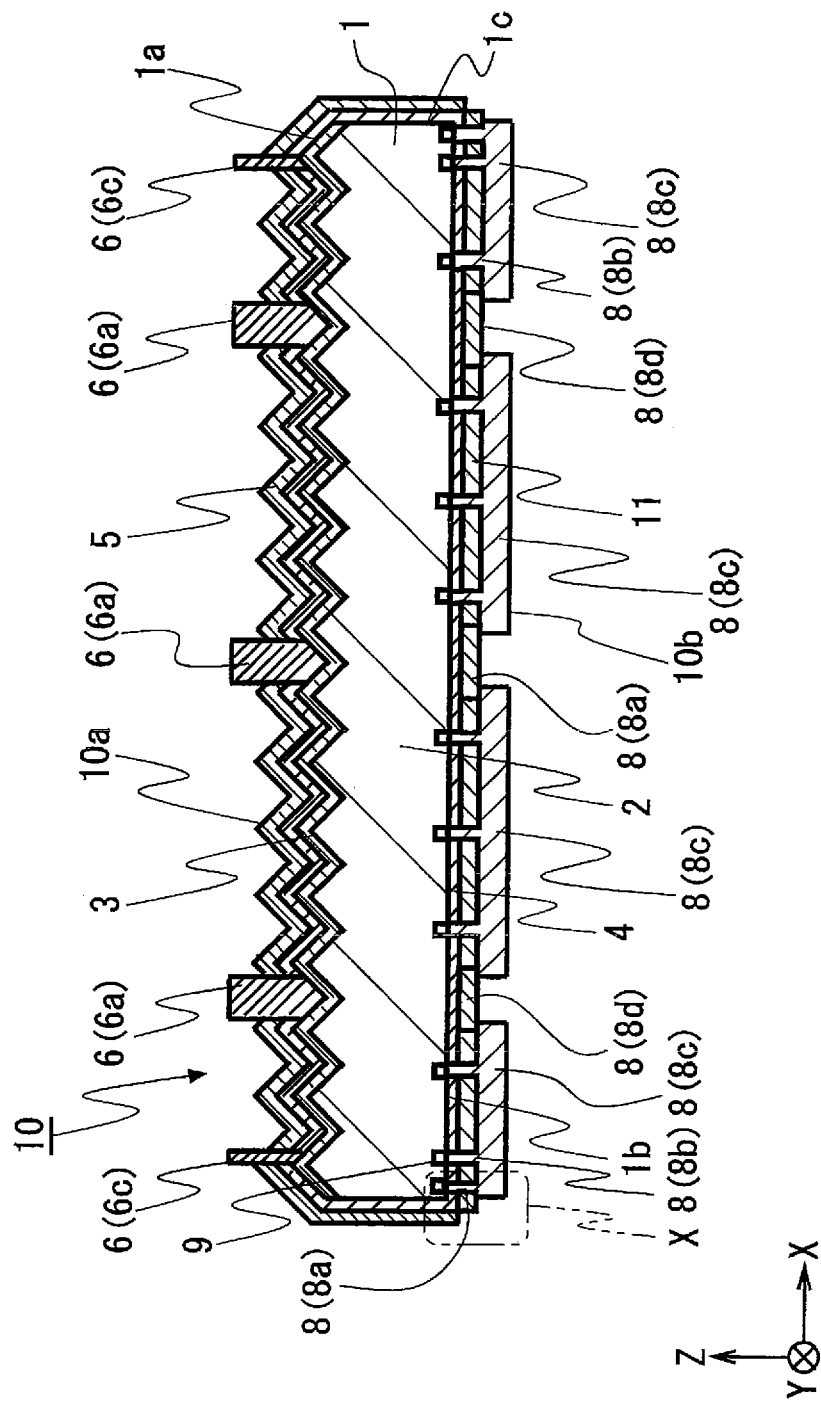
FIG. 9 illustrates an end view showing an end face when the solar cell element is cut along a line IX-IX in FIG. 7
Figure 10:
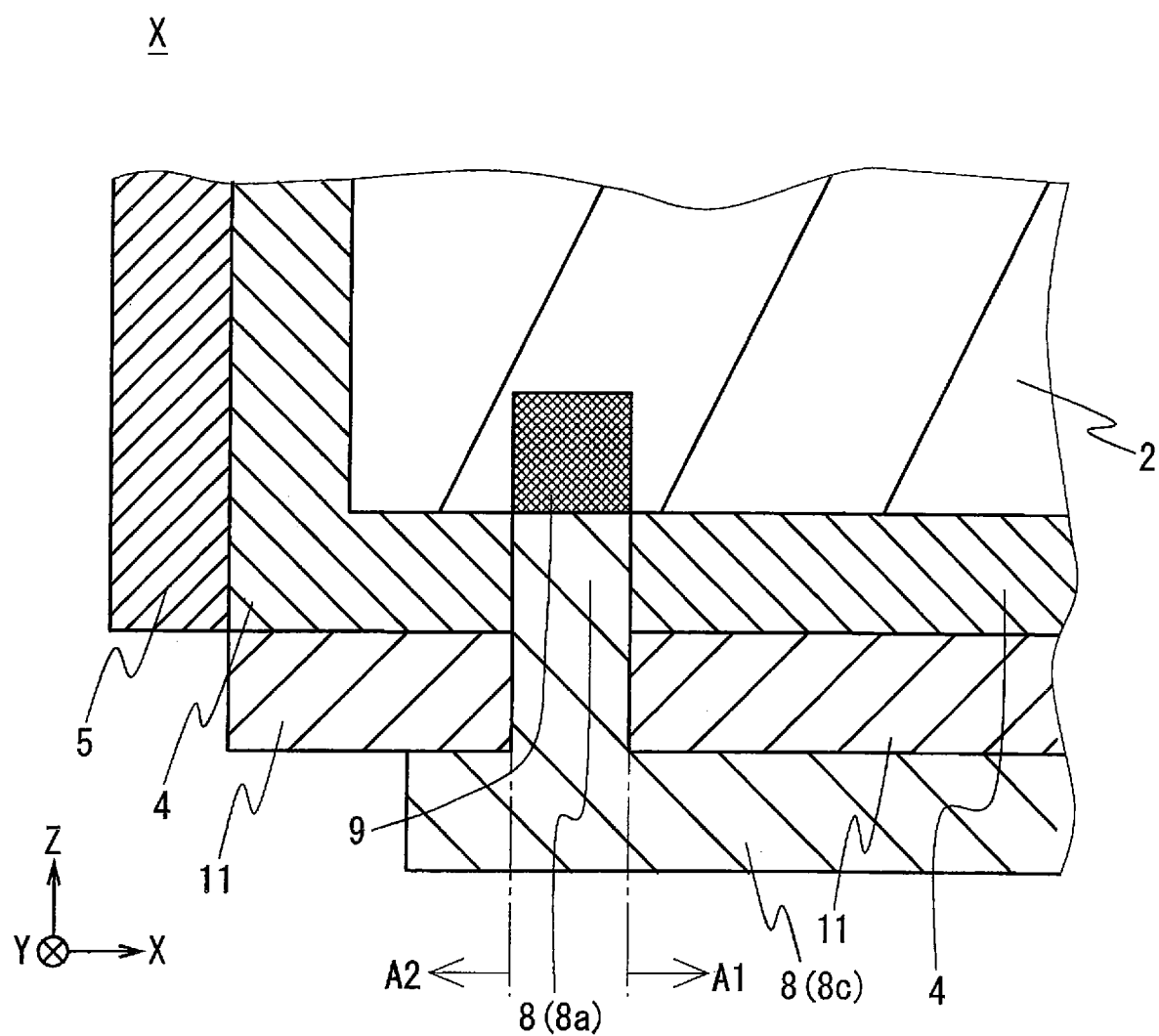
FIG. 10 illustrates an enlarged end view showing an end face of one example of a portion X in FIG. 9.

In the second embodiment, for example, the protective layer 11 is positioned up to the peripheral edge of the passivation layer 4. In other words, for example, when the semiconductor substrate 1 is seen from the second surface 1b side in plane perspective view, the protective layer 11 is positioned between the back first electrode 8a and the peripheral edge of the semiconductor substrate 1. Therefore, for example, the passivation layer 4 can be more reliably protected by the protective layer 11. Here, for example, the protective layer 11 positioned in the vicinity of the peripheral edge of the passivation layer 4 may be partially covered with the back third electrode 8c or entirely covered with the back third electrode 8c, or may not be entirely covered with the back third electrode 8c. In other words, for example, at least a part of the protective layer 11 positioned in the vicinity of the peripheral edge of the passivation layer 4 may be covered with the back-surface electrode 8. From another standpoint, it is sufficient that the protective layer 11 positioned in the vicinity of the peripheral edge of the passivation layer 4 includes, for example, a portion positioned between the passivation layer 4 and the third back electrode 8c. In the example of FIGS. 8 to 10, when the semiconductor substrate 1 is seen from the second surface 1b side in plane perspective view, the back third electrode 8c is positioned between the back first electrode 8a and the peripheral edge of the semiconductor substrate 1. In addition, here, for example, the back first electrode 8a surrounds the passivation layer 4 and the protective layer 11 positioned in the first region A1 from the outer peripheral side of the solar cell element 10. Therefore, for example, even if the peripheral edge of the protective layer 11 or the peripheral edge of the back third electrode 8c peels off due to a temperature change during formation of the back-surface electrode 8 or the like, due to the presence of the back first electrode 8a, the peeling of the protective layer 11 and the back third electrode 8c hardly progresses toward the center of the solar cell element 10. As a result, for example, the protective layer 11 hardly peels off the passivation layer 4. Further, for example, the back-surface electrode 8 is also in close contact with the semiconductor substrate 1 at the back first electrode 8a, and the back-surface electrode 8 hardly peels off the semiconductor substrate 1.

In the second embodiment, the back first electrode 8a is also positioned on the side surface sides of the passivation layer 4 and the protective layer 11. For example, the side surfaces of the passivation layer 4 and the protective layer 11 positioned in the first region A1 are surrounded by the back first electrode 8a. Thereby, entry of moisture toward the passivation layer 4 positioned in the first region A1 from the peripheral edge side of the solar cell element 10 can be reduced. As a result, for example, the deterioration of the passivation layer 4 in the first region A1 is reduced, and the electrical characteristics in the solar cell element 10 hardly deteriorate under the actual use environment. Therefore, the long-term reliability of the solar cell element 10 under the actual use environment can be improved.

2-2. Third Embodiment

In the solar cell element 10 according to each of the above embodiments, for example, the back first electrode 8a may include a plurality of linear electrode portions 8a1, 8a2. In this case, the length of each of the linear electrode portions 8a1, 8a2 is, for example, about 10 mm to 40 mm. Here, for example, when the solar cell element 10 is seen from the second surface 1b side of the semiconductor substrate 1 in plane perspective view, along the direction crossing the linear direction inward from the peripheral edge of the semiconductor substrate 1, a plurality of linear electrode portions 8a1, 8a2 may be arranged alternately. For example, the adjacent linear electrode portions 8a1, 8a2 may be arranged so that parts of these adjacent linear electrode portions 8a1, 8a2 overlap alternately. At this time, for example, the plurality of linear electrode portions 8a1, 8a2 are annularly arranged as a whole.

Figure 11:
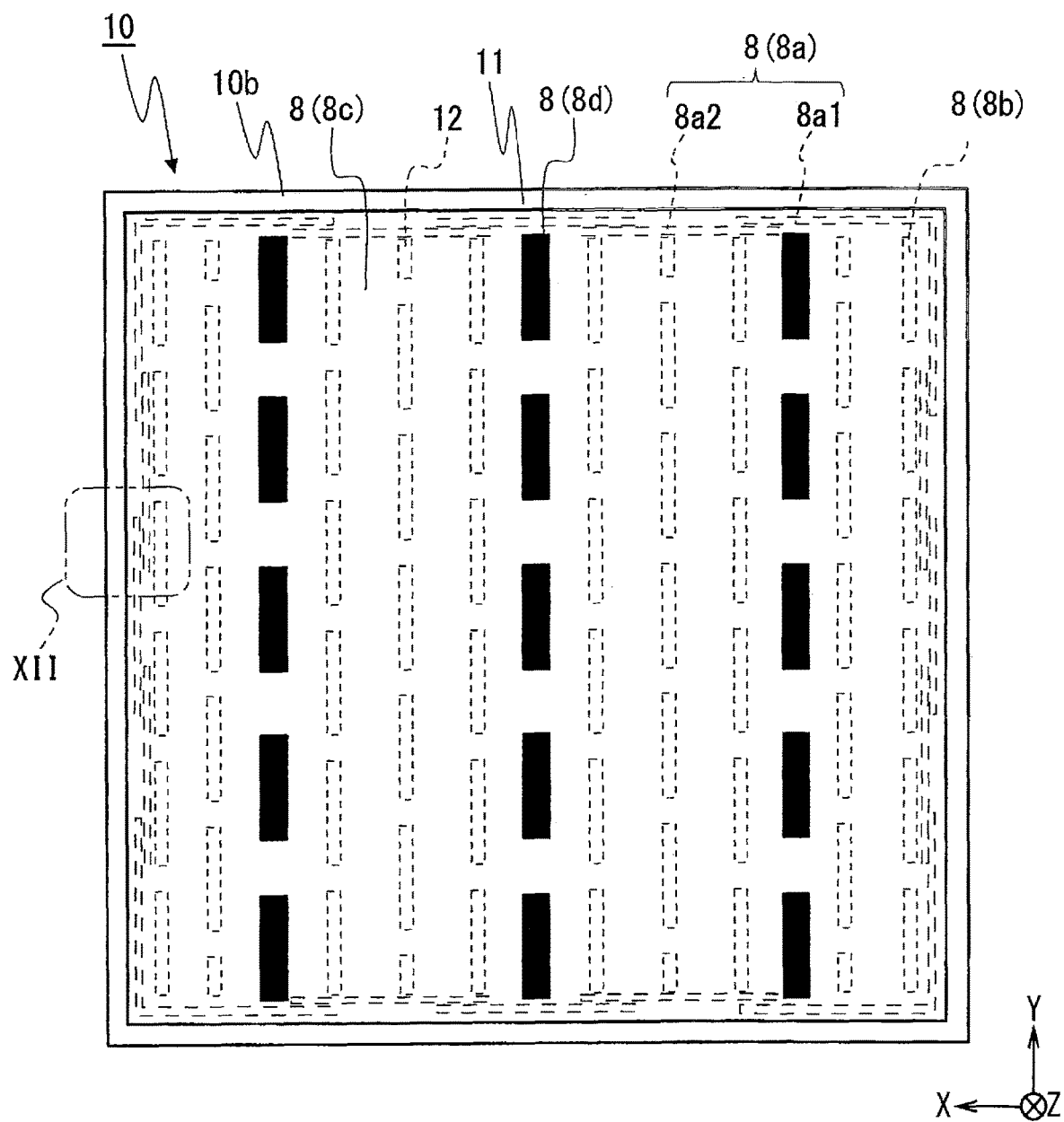
FIG. 11 illustrates a plan view showing an appearance of a second surface side of one example of a solar cell element according to a third embodiment.
Figure 12:
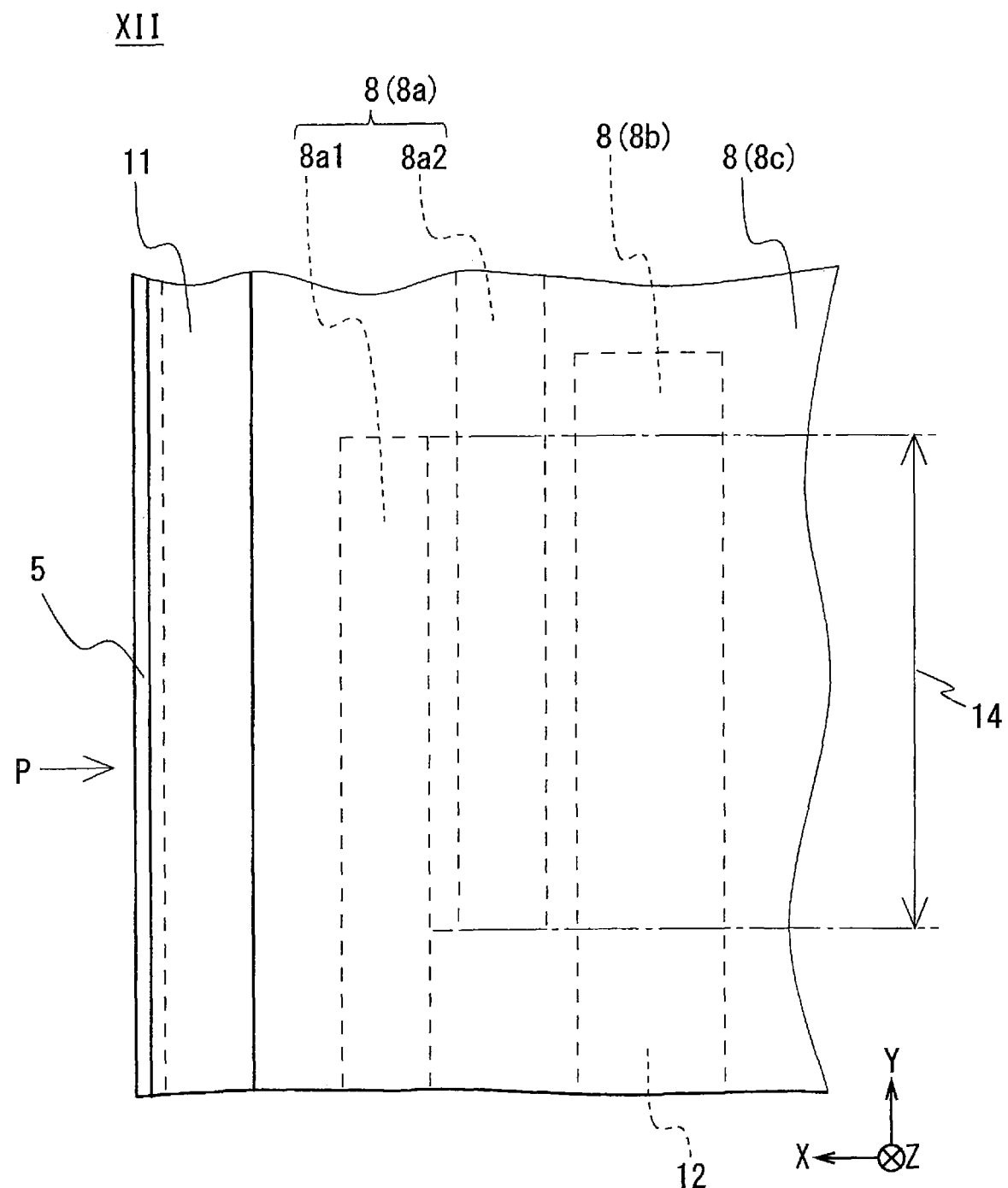
FIG. 12 illustrates an enlarged plan view showing an appearance of an example of a portion XII in FIG. 11.
Figure 13:
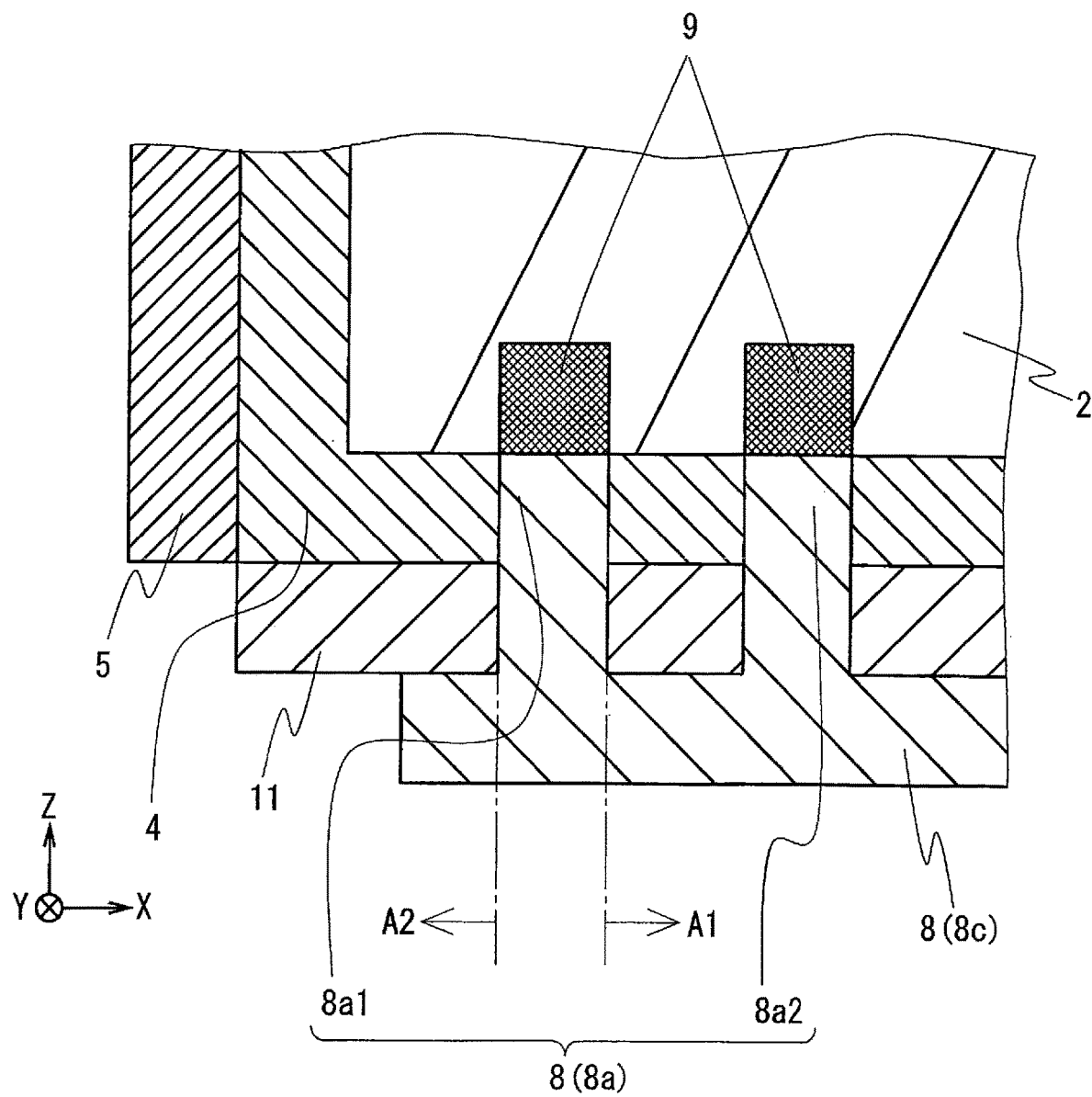
FIG. 13 illustrates an enlarged end view showing an end face of one example of a portion of the solar cell element according to the third embodiment, the portion corresponding to a portion X in FIG. 9.

As shown in FIGS. 11 to 13, the third embodiment is different from the second embodiment in that, for example, the back first electrode 8a is made up of a first linear electrode portion 8a1 and a second linear electrode portion 8a2 as a plurality of linear electrode portions. The other configurations of the third embodiment are similar to those of the second embodiment, and hence the explanation will be omitted.

For example, the back first electrode 8a of the third embodiment is made up of one or more first linear electrode portions 8a1 positioned on the peripheral edge side of the semiconductor substrate 1, and one or more second linear electrode portions 8a2 positioned closer to the central part side of the semiconductor substrate 1 than the one or more first linear electrode portions 8a1. Further, as shown in FIG. 12, for example, it is assumed that the semiconductor substrate 1 is seen through from the side surface 1c side in a direction indicated by an arrow P. At this time, for example, the adjacent first linear electrode portion Sal and the second linear electrode portion 8a2 include a region 14 in which a part of the first linear electrode portion 8a1 and a part of the second linear electrode portion 8a2 overlap with each other. When the length of the region 14 is set to, for example, 2 mm to 15 mm, the peeling of the back third electrode 8c from the peripheral edge side toward the central part side of the solar cell element 10 can be reduced. In addition, when the interval between the first linear electrode portion 8a1 and the second linear electrode portion 8a2 is set to, for example, 100 μm to 500 μm, the peeling of the back third electrode 8c from the peripheral edge side toward the central part side of the solar cell element 10 can be reduced.

Here, for example, when the semiconductor substrate 1 is seen from the second surface 1b side in plane perspective view, each linear electrode portion may be inclined to one side of the semiconductor substrate 1 positioned in the vicinity of these first linear electrode portion 8a1 and second linear electrode portion 8a2. In addition, for example, when the semiconductor substrate 1 is seen from the second surface 1b side in plane perspective view, each of the first linear electrode portion 8a1 and the second linear electrode portion 8a2 may be positioned in an arc shape.

Also, in the solar cell element 10 according to the third embodiment, similar effects to those of the solar cell element 10 according to the second embodiment can be obtained. Furthermore, in the solar cell element 10 according to the third embodiment, for example, the contact area between the second surface 1b of the semiconductor substrate 1 and the back first electrode 8a can be increased. Thereby, for example, the adhesion between the semiconductor substrate 1 and the back-surface electrode 8 can be improved. As a result, the electrical characteristics in the solar cell element 10 are even less likely to deteriorate under the actual use environment.

2-3. Fourth Embodiment

In the solar cell element 10 according to each of the above embodiments, for example, some contact holes 12 in the protective layer 11 may be replaced with a notched gap region 12D positioned so as to extend to the peripheral edge of the protective layer 11. Here, for example, the gap region 12D is positioned so as to extend to the peripheral edge of the protective layer 11 in the longitudinal direction.

Figure 14:
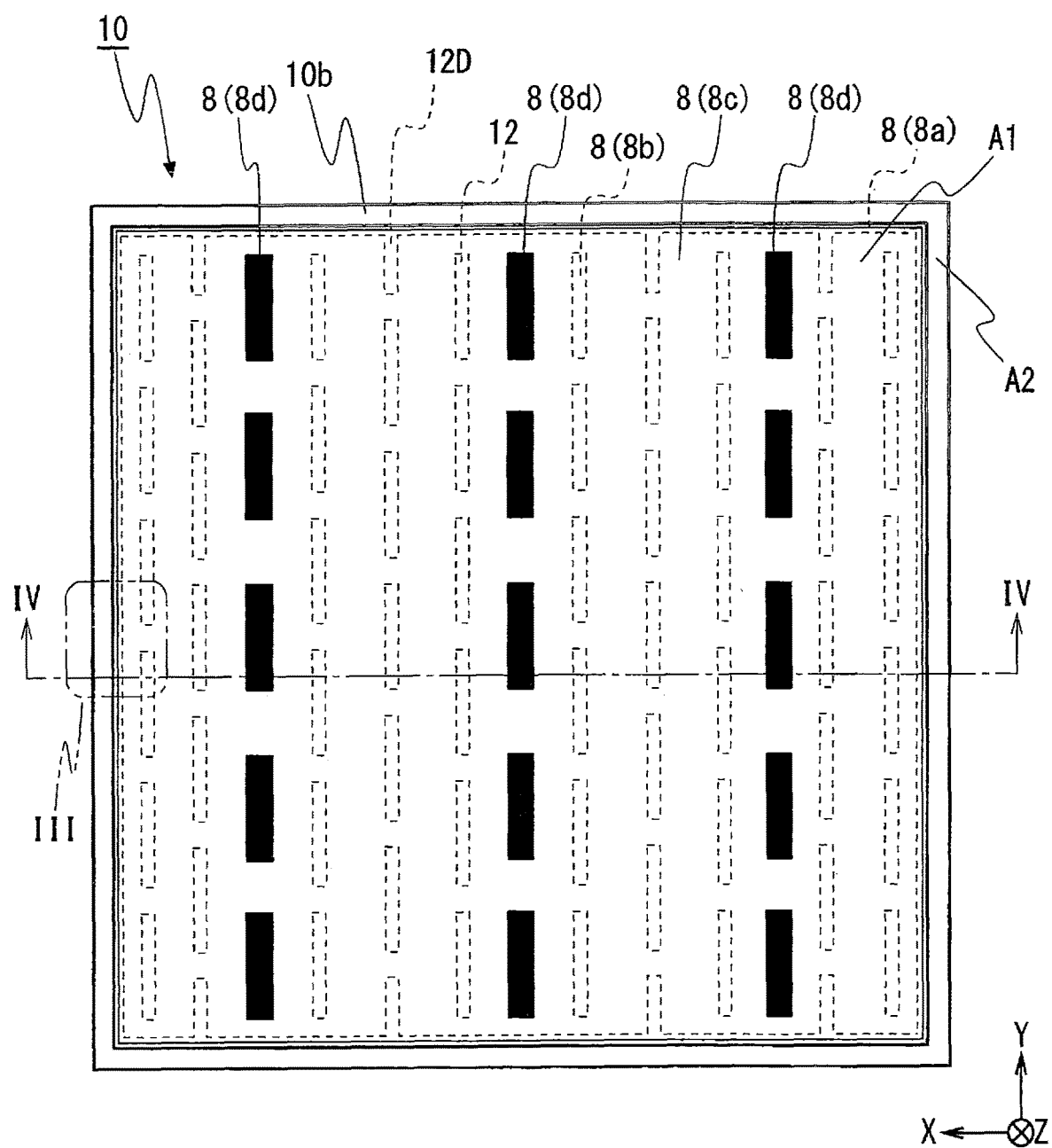
FIG. 14 illustrates a plan view showing an appearance of a second surface side of one example of a solar cell element according to a fourth embodiment.

As shown in FIG. 14, the fourth embodiment is different from the first embodiment in that, for example, some contact holes 12 positioned in the vicinity of the peripheral edge of the protective layer 11 in the longitudinal direction of the contact hole 12 among the plurality of contact holes 12 are replaced with the gap region 12D. Here, for example, some contact holes 12 or all of the contact holes 12 positioned near the peripheral edge of the protective layer 11 in the longitudinal direction of the contact hole 12 among the plurality of contact holes 12 may be replaced with the notched gap region 12D.

Here, for example, when the semiconductor substrate 1 is seen from the second surface 1b side in plane perspective view, as the distance from the central part of the protective layer 11 increases, the protective layer 11 is more likely to be deformed due to the influence of expansion and contraction according to the temperature change. Here, for example, it is assumed that the protective layer 11 is formed by application and heating of the insulating paste. When the insulating paste contains, for example, a siloxane resin to be a raw material of the protective layer 11, an organic solvent, and a plurality of fillers, condensation polymerization of the siloxane resin occurs at the time of heating the insulating paste, and in the protective layer 11, stress that shrinks from the peripheral edge toward the central part of the protective layer 11 may occur.

On the other hand, in the fourth embodiment, for example, when the semiconductor substrate 1 is seen from the second surface 1b side in plane perspective view, a notched gap region 12D is positioned at the peripheral edge of the protective layer 11. Therefore, for example, when the semiconductor substrate 1 is seen from the second surface 1b side in plane perspective view, the distance from the central part to the peripheral edge in the protective layer 11 is short in the portion where the notched gap region 12D is present. Thereby, for example, the stress caused by expansion and contraction due to a temperature change or contraction caused by condensation polymerization can be reduced in the protective layer 11. As a result, for example, the protective layer 11 hardly peels from the passivation layer 4. Therefore, the electrical characteristics in the solar cell element 10 are even less likely to deteriorate under the actual use environment.

2-4. Fifth Embodiment

Figure 15:
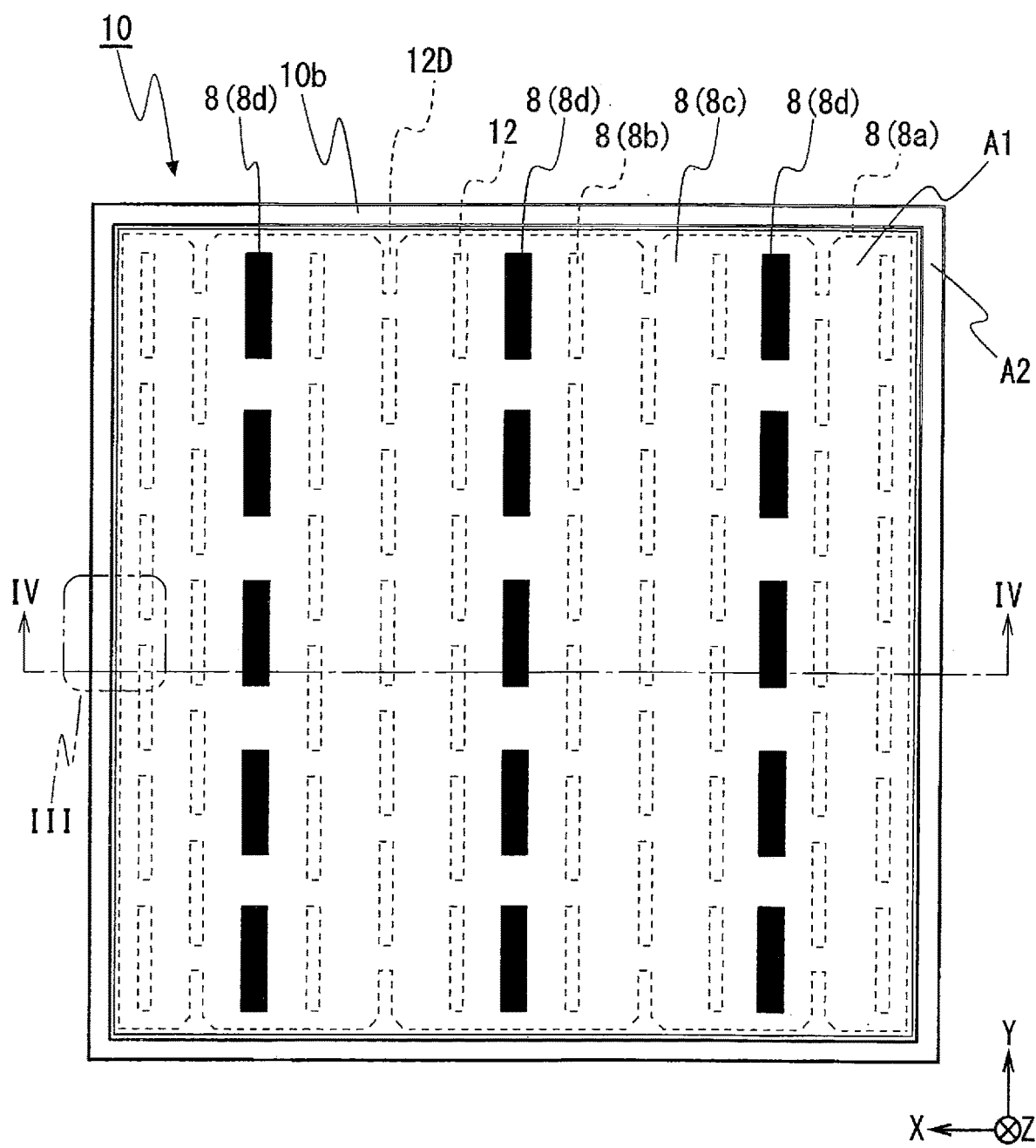
FIG. 15 illustrates a plan view showing an appearance of a second surface side of one example of a solar cell element according to a fifth embodiment.

In the solar cell element 10 according to the fourth embodiment, for example, as shown in FIG. 15, when the semiconductor substrate 1 is seen from the second surface 1b side in plane perspective view, the width of the notched gap region 12D may expand toward the outer edge of the protective layer 11 (or the peripheral edge of the semiconductor substrate 1). When such a structure is adopted, for example, stress generated in the outer edge portion of the protective layer 11 tends to be relaxed in the portion of the protective layer 11 in which the notched gap region 12D is present Thereby, for example, the protective layer 11 hardly peels from the passivation layer 4. Therefore, the electrical characteristics in the solar cell element 10 are even less likely to deteriorate under the actual use environment.

3. Others

The present disclosure is not limited to each of the embodiments described above, but various modifications, improvements, and the like as described below are possible, for example.

Further, for example, the shape of the contact hole 12 of the protective layer 11 where the back second electrode 8b is positioned may be a hole shape (or a dot shape), a groove shape (or a line shape). Here, for example, the contact hole 12 in which the back second electrode 8b is positioned may have a diameter (or a width) of 10 µm to 150 µm, and a pitch of about 0.05 mm to 2.0 mm between the back second electrodes 8b. In addition, each of the contact hole 12 and the back second electrode 8b may be positioned in, for example, a grid pattern or a zigzag pattern.

Further, for example, the front-surface electrode 6 and the back-surface electrode 8 may be formed by applying the metal pastes for forming the respective electrodes and then simultaneously firing these metal pastes. Thus, for example, the productivity of the solar cell element 10 is improved, and the output characteristics of the solar cell element 10 can also be improved by reduction in history of heat that is applied to the semiconductor substrate 1 and the like.

In addition, for example, the passivation layer 4 may be formed on the antireflection layer 5. Thereby, for example, when the antireflection layer 5 that contains silicon nitride with positive fixed charge is formed, it is possible to reduce recombination of electrons and holes in the region of the semiconductor substrate 1 in the vicinity of the first surface 1a due to the passivation effect.

Further, for example, when the semiconductor substrate 1 is seen from the second surface 1b side in plane perspective view, the back second electrode 8b may be positioned closer to the peripheral edge of the semiconductor substrate 1 than the back first electrode 8a, the first linear electrode portion 8a1, and the second linear electrode portion 8a2.

Further, for example, the back first electrode 8a may be made of a different metal from the metal for any of the back second electrode 8b, the back third electrode 8c, and the back fourth electrode 8d.

Further, for example, the protective layer 11 may not be positioned on the passivation layer 4, but the back-surface electrode 8 may be positioned on the passivation layer 4. In this case, for example, the back-surface electrode 8 may be formed on the passivation layer 4. Even when such a configuration is adopted, for example, the back-surface electrode 8 is in close contact with the semiconductor substrate 1 at the back first electrode 8a along the peripheral edge of the semiconductor substrate 1, and hardly peels from the semiconductor substrate 1. Thereby, the electrical characteristics in the solar cell element 10 hardly deteriorate under the actual use environment. Further, for example, the side surface of the passivation layer 4 positioned in the first region A1 is surrounded by the back first electrode 8a, and entry of moisture from the peripheral edge of the solar cell element 10 toward the passivation layer 4 can be reduced. Thus, for example, deterioration of the passivation layer 4 in the first region A1 can be reduced. Thereby, the electrical characteristics in the solar cell element 10 hardly deteriorate under the actual use environment. Therefore, the long-term reliability in the solar cell element 10 under the actual use environment can be improved.

EXAMPLES

Next, examples will be described.

Twenty solar cell elements for each solar cell element having representative configuration were produced as follows.

First, as shown in FIG. 6A, an ingot of polycrystalline silicon having a p type conductivity type was produced by the casting method. Subsequently, the ingot was cut into slices each having a thickness of about 150 μm to obtain the semiconductor substrate 1.

Next, as shown in FIG. 6B, a mechanically damaged layer and a contaminated layer on the cut surface of the semiconductor substrate 1 were removed by wet etching using nitric hydrofluoric acid on the first surface 1a of the semiconductor substrate 1, thereby forming the uneven part 7.

Next, as shown in FIG. 6C, the n type second semiconductor region 3 was formed on the first surface 1a of the semiconductor substrate 1 having the uneven part 7. Here, phosphorus pentoxide ($P_2O_5$) in a paste state was applied onto the first surface 1a of the semiconductor substrate 1, and phosphorus was thermally diffused into the surface layer part of the semiconductor substrate 1 from the applied paste by heating, to form the second semiconductor region 3. Thereafter, phosphorus glass having adhered to the first surface 1a side of the semiconductor substrate 1 was removed by etching.

Next, as shown in FIG. 6D, the passivation layer 4 was formed on at least the second surface 1b side of the semiconductor substrate 1. The passivation layer 4 was formed not only on the second surface 1b side of the semiconductor substrate 1 but also on the first surface 1a side and the side surface 1c side by the ALD method. Here, first, the semiconductor substrate 1 with the second semiconductor region 3 formed thereon was placed in the chamber of the film forming apparatus. Next, in a state where the semiconductor substrate 1 was heated so that the surface temperature of the semiconductor substrate 1 was about 150° C., four steps of supply of the aluminum raw material, removal of the aluminum raw material by exhaust, supply of an oxidizing agent, and removal of the oxidizing agent by exhaust were repeated multiple times. Thereby, the passivation layer 4 of aluminum oxide having a thickness of about 30 nm was formed, Next, as shown in FIG. 6D, the antireflection layer 5 was formed on at least the first surface 1a side of the semiconductor substrate 1. Here, by the PECVD, a mixed gas of silane ($SiH_4$) gas and ammonia ($NH_3$) gas was diluted with nitrogen ($N_2$) gas method and turned into plasma by glow discharge decomposition in the chamber, to be deposited in the form of silicon nitride on the passivation layer 4. Thereby, an antireflection layer 5 having a thickness of about 65 μm was formed.

Next, as shown in FIG. 6E, on the passivation layer 4 formed on the second surface 1b side of the semiconductor substrate 1, the protective layer 11 of silicon oxide having a thickness of 2 μm was formed by the screen-printing method.

In the protective layer 11, the contact hole 12 for providing electrical connection between the back-surface electrode 8 and the semiconductor substrate 1 was provided. The contact hole 12 for forming the back second electrode 8b was formed so as to have a width of 50 μm and a length of 1 mm by laser beam irradiation. In addition, the contact hole 12 for forming the back first electrode 8a was formed so as to have a width of 200 μm by laser beam irradiation.

Next, as shown in FIG. 6F, the front-surface electrode 6 and the back-surface electrode 8 were formed as follows.

The front-surface electrode 6 was produced using a metal paste (first metal paste) that contains a metal powder containing silver as a main component, an organic vehicle, and a glass frit. Here, first, the first metal paste was applied to the first surface 1a side of the semiconductor substrate 1.

The back fourth electrode 8d was produced using a metal paste (second metal paste) that contains a metal powder containing silver as a main component, an organic vehicle, and a glass frit. Here, first, the second metal paste was applied onto the passivation layer 4 on the second surface 1b side of the semiconductor substrate 1. The back first electrode 8a, the back second electrode 8b, and the back third electrode 8c were produced using a metal paste (third metal paste) that contains a metal powder containing aluminum as a main component, an organic vehicle, and a glass frit. Here, the third metal paste was applied to the second surface 1b side of the semiconductor substrate 1 so as to overlap and contact a part of the second metal paste applied for forming the back fourth electrode 8d. At this time, on the second surface 1b side of the semiconductor substrate 1, the third metal paste was applied to almost the entire surface of the portion to which the second metal paste for forming the back fourth electrode 8d had not been applied. Thereby, the third metal paste was also applied onto the passivation layer 4 positioned in the contact hole 12 of the protective layer 11. Then, the semiconductor substrate 1 to which the first metal paste, the second metal paste, and the third metal paste had been applied was heated in a condition that the maximum temperature was maintained at 720° C. for about 1 minute. At this time, the first metal paste, the second metal paste, and the third metal paste were fired to form the front-surface electrode 6 and the back-surface electrode 8.

The sample of Example 1 was produced as described above. Here, as for the sample of Example 2, as shown in FIG. 10, in the direction from the central part to the outer edge part on the second surface 1b of the semiconductor substrate 1, the length of the protective layer 11 extending to the second region A2 was set to 400 μm and the length of the back third electrode 8c extending to the second region A2 was set to 200 μm. In Example 2, the contact hole 12 for forming the back first electrode 8a was formed to have a width of 200 μm by laser beam irradiation. As for the sample of Example 3, the contact hole 12 for forming the first linear electrode portion 8a1 and the second linear electrode portion 8a2 was formed so as to have a width of 200 μm by laser beam irradiation. Further, as shown in FIG. 11, the total number of the first linear electrode portions 8a1 and the second linear electrode portions 8a2 was set to 5 per side of the second surface 1b of the semiconductor substrate 1. Thereby, the total number of the first linear electrode portions 8a1 and the second linear electrode portions 8a2 was set to 20 as a whole. Further, as shown in FIG. 12, the length of the region 14 in which a part of the first linear electrode portion 8a1 and a part of the second linear electrode portion 8a2 overlap was set to 15 mm. Moreover, the interval between the first linear electrode portion 8a1 and the second linear electrode portion 8a2 was set to 300 μm.

Figure 16:
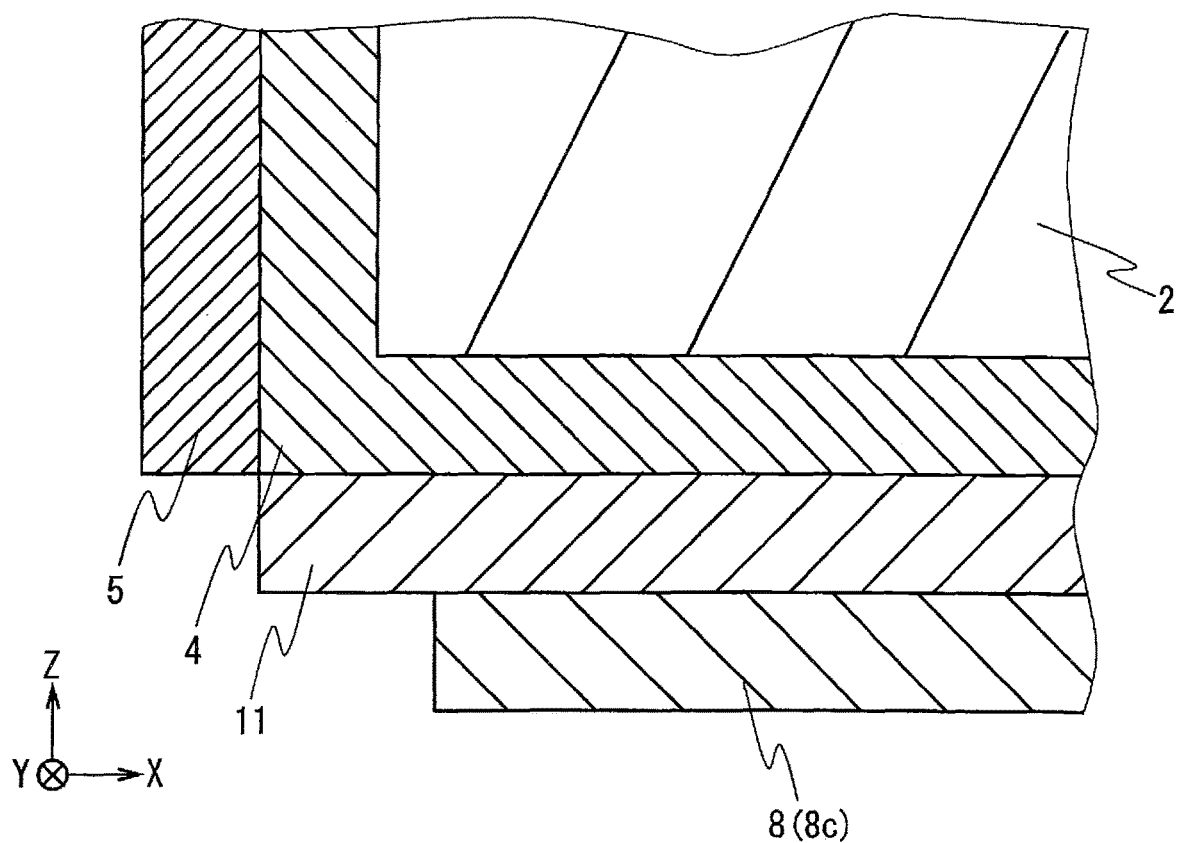
FIG. 16 illustrates an enlarged end view showing an end face of one example of a portion of a solar cell element according to a reference example, the portion corresponding to a portion X in FIG. 9.

Twenty samples of a reference example having the configuration as shown in FIG. 16 were produced. Here, the sample of the reference example was produced in a similar step to that in the second embodiment except that the contact hole 12 for the back first electrode 8a and the back first electrode 8a were not formed.

For each sample, a peeling test was conducted by sticking an adhesive tape from the peripheral edge where the back third electrode 8c was not formed to the central part where the back third electrode 8c was formed along the longitudinal direction of the back second electrode 8*b* and the back fourth electrode 8*d* on the second surface 10*b* of the solar cell element 10. The adhesive tape having a width of 20 mm and an adhesive force of 3.27 N/cm was used.

As a result of the peeling test, in any of the samples of Example 1 to Example 3, peeling of the back third electrode 8*c* was not observed in a portion closer to the central part side than the back first electrode 8*a*, the first linear electrode portion 8*a*1, or the second linear electrode portion 8*a*2 on the second surface 10*b*. Also, no peeling between the protective layer 11 and the passivation layer 4 was observed. On the other hand, out of the samples of the reference example, peeling of the back third electrode 8*c* was observed in the range up to the central part on the second surface 1*b* in the samples of 15%, and peeling between the protective layer 11 and the passivation layer 4 was observed in the range up to the central part on the second surface 1*b* in the samples of 65%.

Further, solar cell elements were produced for each of the samples according to Example 1, Example 2, Example 3, and the reference example. The width of the second region A2 was set to 0.8 mm for the sample of any of Example 1, Example 2, Example 3, and the reference example. The width of the back first electrode 8*a* was set to 200 μm for the samples of Example 1, 200 μm for the samples of Example 2, and 0 μm for the samples of the reference example, and the width of each of the first linear electrode portion 8*a*1 and the second linear electrode portion 8*a*2 was 200 μm in for the samples of Example 3.

The maximum output (Pmax), a short circuit current (Isc), an open circuit voltage (Voc), and a fill factor (FF) were measured for each of the solar cell elements according to the samples of Example 1, Example 2, and Example 3 and the solar cell elements according to the samples of the reference example as produced above. Here, the maximum output, the short circuit current, the open circuit voltage, and the fill factor were measured in conditions in conformity with Japanese Industrial Standards (JIS) C8913. Specifically, the measurements were performed using a fixed light solar simulator in conditions that the light irradiation intensity on the light receiving surface was 100 mW/cm$^2$ and an air mass (AM) was 1.5.

Here, regardless of the presence or absence of the back first electrode 8*a*, little changes were observed in the output characteristics of the solar cell element including the maximum output, the short circuit current, the open circuit voltage, and the fill factor.

The invention claimed is:

1. A solar cell element comprising:
a semiconductor substrate comprising a first surface and a second surface opposite to the first surface;
a passivation layer positioned on the second surface;
a protective layer positioned on the passivation layer; and
an electrode positioned on the protective layer and electrically connected to the semiconductor substrate,
wherein the electrode includes a linear electrode part that is positioned along a peripheral edge of the semiconductor substrate and penetrates the passivation layer in a thickness direction, wherein an outermost peripheral edge of the protective layer is surrounded by the linear electrode part, and
wherein the linear electrode part is positioned continuously and annularly along an outer peripheral portion of the second surface of the semiconductor substrate, and
wherein the linear electrode part surrounds an entire region of the protective layer,
wherein the passivation layer includes a portion positioned along the outer peripheral portion of the second surface and closer to the outer peripheral portion of the second surface than the linear electrode part on the second surface.

2. The solar cell element according to claim 1, wherein the linear electrode part is in contact with the semiconductor substrate.

3. The solar cell element according to claim 1, wherein the electrode is also positioned on side surface sides of the passivation layer and the protective layer.

4. The solar cell element according to claim 1, wherein a notched gap region is positioned at a peripheral edge of the protective layer.

5. The solar cell element according to claim 4, wherein the notched gap region of the protective layer expands toward the outermost peripheral edge of the protective layer.

6. The solar cell element according to claim 1, wherein the linear electrode part is annularly positioned along the outermost peripheral edge of the protective layer and surrounds entirely the outermost peripheral edge of the protective layer.

7. The solar cell element according to claim 6, wherein the electrode covers an entire surface of the protective layer opposite to the passivation layer.

8. A solar cell element comprising:
a semiconductor substrate comprising a first surface and a second surface opposite to the first surface;
a passivation layer positioned on the second surface;
a protective layer positioned on the passivation layer; and
an electrode positioned on the protective layer and electrically connected to the semiconductor substrate,
wherein the electrode includes a linear electrode part that is positioned along a peripheral edge of the semiconductor substrate and penetrates the passivation layer in a thickness direction, wherein an outermost peripheral edge of the protective layer is surrounded by the linear electrode part, and
wherein the linear electrode part is positioned continuously and annularly along an outer peripheral portion of the second surface of the semiconductor substrate, and
wherein the linear electrode part surrounds an entire region of the protective layer,
wherein a notched gap region is positioned at a peripheral edge of the protective layer, and
wherein the notched gap region of the protective layer expands toward the outermost peripheral edge of the protective layer.

* * * * *